US006819968B1

(12) United States Patent
Funk

(10) Patent No.: US 6,819,968 B1
(45) Date of Patent: Nov. 16, 2004

(54) APPARATUS AND METHOD FOR MANUFACTURING INTEGRATED CIRCUIT DEVICES

(75) Inventor: Kevin K. Funk, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 420 days.

(21) Appl. No.: 09/643,389

(22) Filed: Aug. 22, 2000

Related U.S. Application Data

(62) Division of application No. 09/034,967, filed on Mar. 4, 1998, now Pat. No. 6,136,614.

(51) Int. Cl.[7] .............................................. G06F 19/00
(52) U.S. Cl. ....................................................... 700/121
(58) Field of Search .................... 700/95–121, 213–226

(56) References Cited

U.S. PATENT DOCUMENTS

| 4,095,095 A | * | 6/1978 | Muraoka et al. ............. 235/375 |
| 4,930,086 A | * | 5/1990 | Fukasawa .................... 700/116 |
| 5,325,582 A | * | 7/1994 | Glaser et al. .................. 29/840 |
| 5,432,702 A | * | 7/1995 | Barnett ........................ 700/116 |
| 5,434,790 A | * | 7/1995 | Saka et al. ................... 700/110 |
| 5,442,561 A | * | 8/1995 | Yoshizawa et al. .......... 700/100 |
| 5,536,128 A | * | 7/1996 | Shimoyashiro et al. ..... 414/273 |
| 5,570,293 A | * | 10/1996 | Tanaka et al. .......... 364/468.28 |
| 5,668,056 A | * | 9/1997 | Wu et al. ..................... 438/106 |
| 5,692,292 A | * | 12/1997 | Asai et al. ...................... 29/740 |
| 5,740,052 A | * | 4/1998 | Nakamura .............. 364/468.28 |
| 5,751,581 A | * | 5/1998 | Tau et al. ..................... 700/115 |
| 5,828,989 A | * | 10/1998 | Zvonar et al. ............... 702/188 |
| 5,883,374 A | * | 3/1999 | Mathews ...................... 235/454 |
| 5,942,739 A | * | 8/1999 | Zvonar et al. .......... 235/462.01 |
| 6,000,830 A | * | 12/1999 | Asano et al. ........... 364/468.28 |
| 6,138,058 A | * | 10/2000 | Van Antwerp, Jr. et al. 700/225 |
| 6,265,684 B1 | * | 7/2001 | Wu .............................. 209/583 |

FOREIGN PATENT DOCUMENTS

| JP | 08-177051 | * | 1/1998 |
| JP | 08-303480 | * | 5/1998 |

* cited by examiner

Primary Examiner—Maria N. Von Buhr

(57) ABSTRACT

The present invention is directed to a control system for a photolithographic integrated circuit manufacturing process. The control system incorporates a visual gating device in which a series of nests are provided. A barcode reader may be provided in conjunction with some of the nests. In operation, a human operator advances wafer lot boxes through the nest positions in accordance with a series of displays which are controlled by the control system. The barcode reader associated with each nest reads a barcode label on the wafer lot box contained within the nest to determine the lot number corresponding to the lot box. This lot number is then used by the control system to obtain setup parameters for the various photolithographic manufacturing process operations.

5 Claims, 15 Drawing Sheets

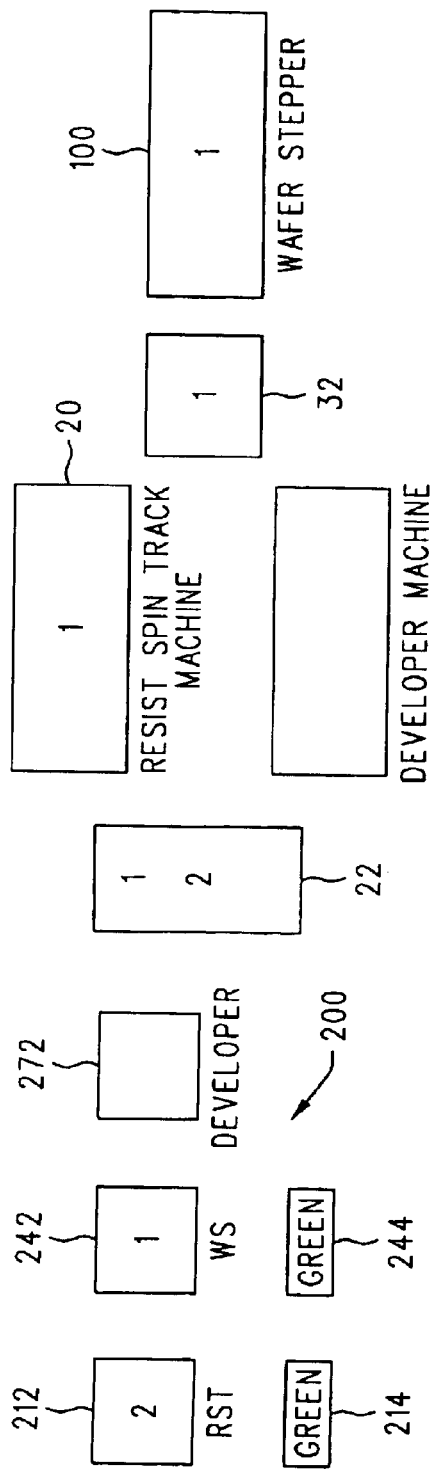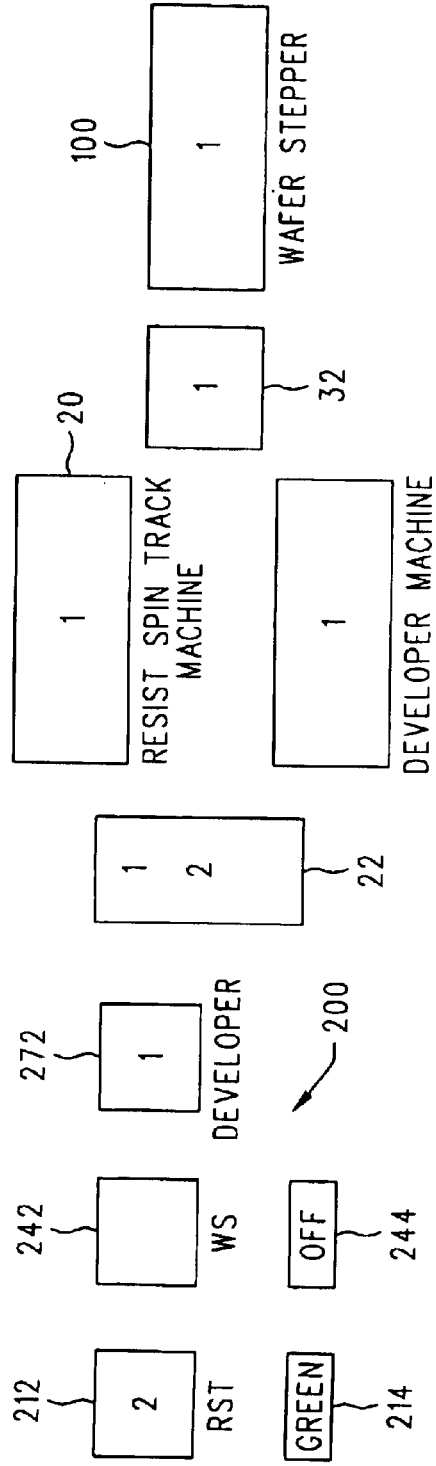

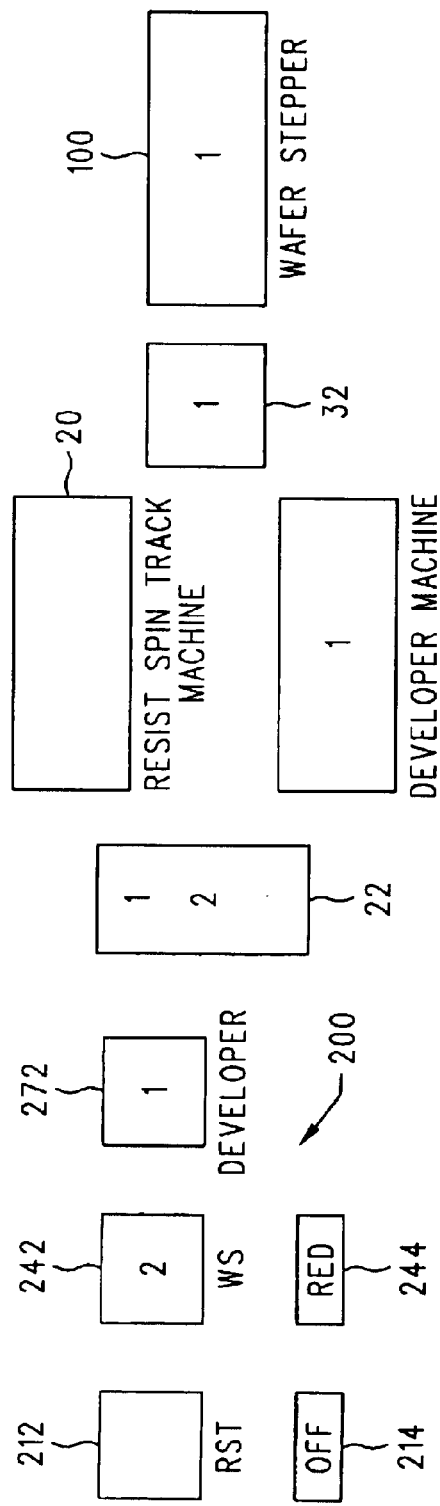
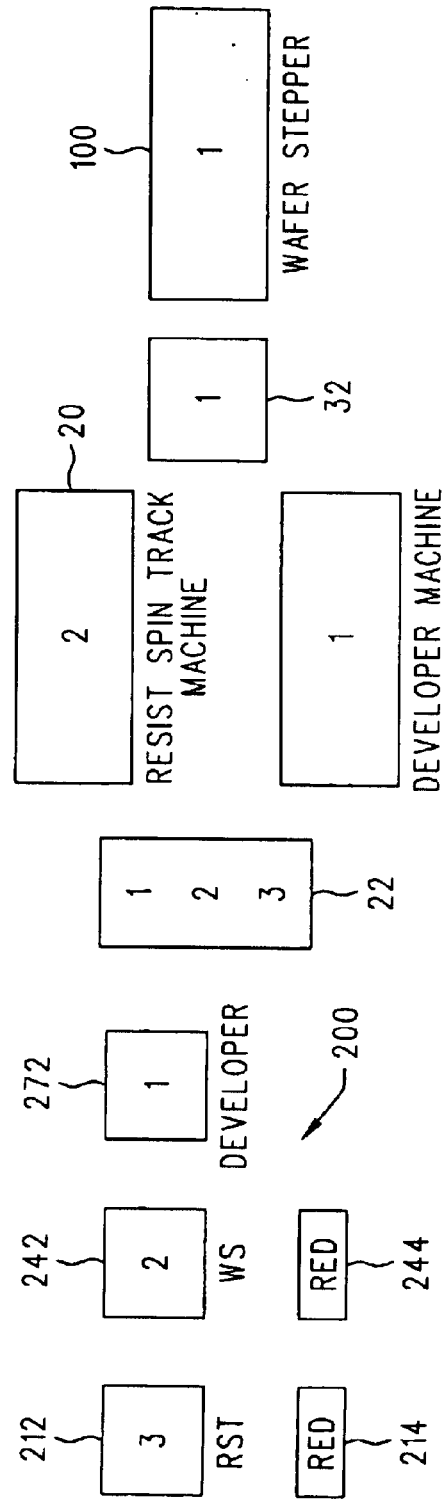

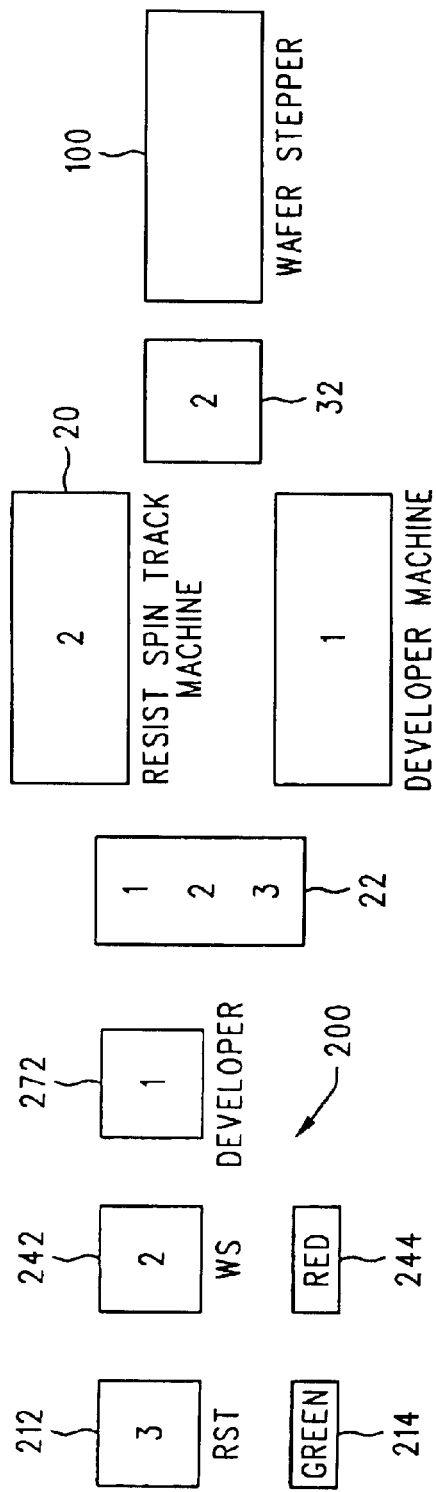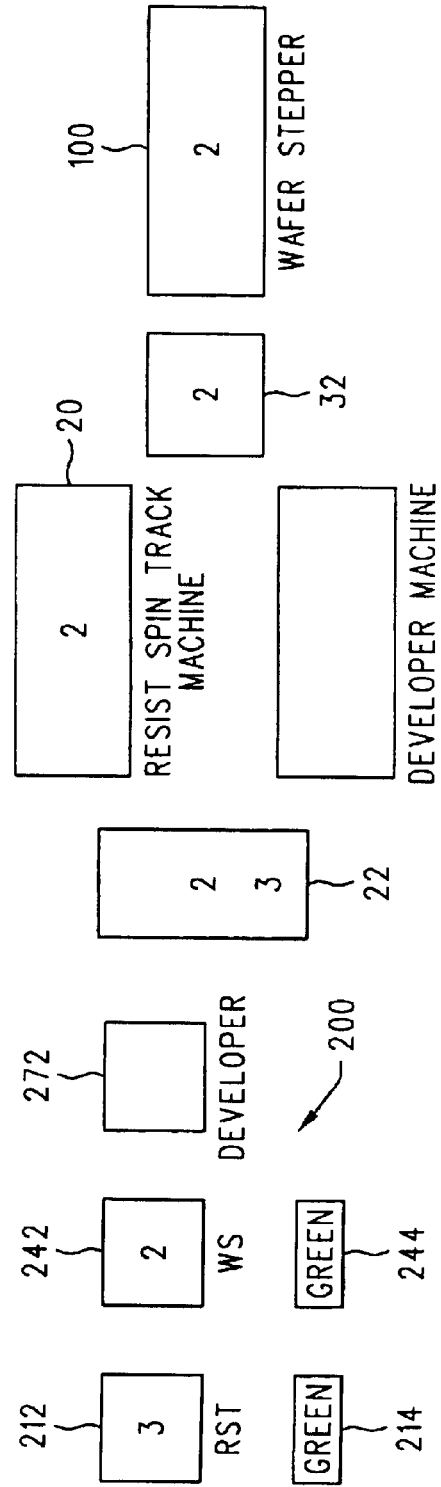

APPARATUS AND METHOD FOR MANUFACTURING INTEGRATED CIRCUIT DEVICES

CROSS REFERENCE TO RELATED APPLICATIONS

This application is a divisional of application Ser. No. 09/034,967 filed Mar. 4, 1998, now U.S. Pat. No. 6,136,614 which is hereby incorporated by reference for all that is disclosed therein.

This application is related to application Ser. No. 09/034,966 for IMPROVED RETICLE LIBRARY APPARATUS AND METHOD of Kevin K. Funk, filed Mar. 4, 1998, now abandoned.

FIELD OF THE INVENTION

The present invention relates generally to integrated circuit manufacturing and, more specifically, to improvements in the efficiency and reliability of integrated circuit manufacturing.

BACKGROUND OF THE INVENTION

Typical integrated circuit devices contain multiple printed circuit layers. Each layer is insulated from its adjacent layer except where interlayer connections are selectively created. The individual circuit layers of an integrated circuit device are typically created by a photolithographic process. Each layer is formed on an integrated circuit device during a separate trip through the photolithographic manufacturing area. After each trip, the integrated circuit device is transported to other manufacturing areas where additional processing steps, such as etching and deposition, are performed. Thereafter, the integrated circuit device is returned to the photolithographic process manufacturing area so that an additional circuit layer may be applied. The process is then repeated until the desired number of circuit layers has been created.

Typically, during the manufacturing process, several integrated circuits are formed on a single silicon substrate which is commonly referred to in the industry as a "wafer". A single wafer may, for example, contain about 100 integrated circuit devices. When the manufacture of the integrated circuits on a wafer is completed, the wafer is sawn apart such that the integrated circuits contained thereon are separated into individual units.

Integrated circuit wafers are generally processed in "lots". Each lot may contain, for example, twenty-four wafers. Each lot represents a specific integrated circuit product, thus each wafer within a given lot will be identical. As can be appreciated from the above, during the integrated circuit manufacturing process, each lot of wafers will be returned to the photolithographic process numerous times in order to have individual circuit layers applied. Each circuit layer is sometimes referred to as a "mask level".

When a lot of wafers arrives at the photolithographic manufacturing area, the wafers are typically housed within a cassette which, in turn, is housed within a lot box. An information sheet, referred to as a "run sheet" is generally attached to the lot box and identifies the specific lot contained within the lot box.

The photolithographic process typically begins in a machine generally known in the industry as a "resist spin track" machine. The resist spin track machine may also be referred to herein as a "coating machine". In the resist spin track machine, wafers are spin-coated with a light sensitive photo-resist coating. The photo-resist coating "recipe" used differs for each lot and mask level. To begin the photolithographic process, a human operator removes the cassette from the lot box and places it on an indexer attached to the resist spin track machine. The human operator must also manually select the resist spin track recipe for the lot. To accomplish this, the operator typically enters both the lot number and the mask level (both of which are listed on the run sheet) into a computer database in order to determine the required resist spin track machine recipe for the lot. The operator then enters the recipe information into a control panel associated with the resist spin track machine indexer and depresses a start button, which may also be located on the indexer control panel.

After wafers have been coated with photo-resist material in the resist spin track machine, they are transferred to a "wafer stepper" machine. The wafer stepper machine serves to expose each wafer-mounted integrated circuit with a pattern corresponding to the desired circuit layer. In order to perform this function, the wafer stepper uses an imaging reticle, also commonly referred to in the industry simply as a "reticle", which contains an image of the circuit layer to be applied.

Before the wafer stepper can perform this task, however, it also must be programmed by a human operator. In order to accomplish this programming, the operator must query a central control system to determine the reticle number. The operator then enters both the lot number and the mask level into a separate computer database in order to determine other required wafer stepper parameters. Examples of such parameters include focus information and time of exposure information. As can be appreciated, each of these parameters will vary depending upon the specific lot and mask level of the lot.

After wafers leave the wafer stepper, they enter a developing device, commonly referred to in the industry as a "developer", in which the photoresist chemical exposed in the wafer stepper is fixed or developed. The developer is generally located within the same housing as the resist spin track machine. After a wafer has been developed in the developer, it is usually then returned to its original cassette. When all of the wafers in a lot have been developed and returned to their cassette, the photolithographic process for the mask level is completed and the cassette may then be moved to another processing phase, e.g., the etching process described above.

The above system has resulted in several undesirable operating characteristics. One such undesirable characteristic is mis-entry of information. Specifically, the necessity for human operators to manually look up and enter data (e.g., the recipe name for the resist spin track machine and the reticle, focus and exposure time data for the wafer stepper machine) commonly results in mis-processing due to errors in either obtaining the proper data, in transferring the proper data to the appropriate machine, or both. Such mis-processing, in turn, results in the need to rework material and/or scrapped product.

Another undesirable characteristic associated with the system described above relates to the fact that it is an asynchronous process. Specifically, human operator interface is required at random times in order to maintain the process. After the wafer stepper completes processing a lot, for example, an end of lot signal is produced by the wafer stepper machine. This end of lot signal, in turn, causes an alarm to be activated. Human input is required, in response to this alarm, before the wafer stepper may begin processing the next lot. As described above, the human operator, for example, must look up the parameters for the next lot and enter these parameters into the controller for the wafer stepper machine. If a human operator is not available when the wafer stepper finishes a lot, then the wafer stepper machine will sit idle until a human operator becomes available and completes the data entry task. This results in undesirable equipment downtime and, consequently, a loss of production efficiency for the photolithographic process. Compounding this problem is the fact that a typical photolithographic manufacturing facility may include multiple (e.g., 12) sets of resist spin track/wafer stepper machine combinations. The use of such multiple sets increases the likelihood that the human operator or operators will be otherwise occupied when a particular wafer stepper completes processing a lot.

Accordingly, it would be desirable to provide a manufacturing process which overcomes the problems described above and, thus, increases operating efficiency and reduces rework and scrap events.

SUMMARY OF THE INVENTION

The present invention is directed to a control system for a photolithographic integrated circuit manufacturing process. The control system incorporates a visual gating device in which a series of nests are provided. A barcode reader may be provided in conjunction with each nest. In operation, a human operator advances wafer lot boxes through the nest positions in accordance with a series of displays which are controlled by the control system. The barcode reader associated with each nest reads a barcode label on the wafer lot box contained within the nest to determine the lot number corresponding to the lot box. This lot number is then used by the control system to obtain setup parameters for the various photolithographic manufacturing process operations.

BRIEF DESCRIPTION OF THE DRAWINGS

FIGS. 6–17 are schematic illustrations depicting the the manufacturing system of FIG. 1 in various stages of operation.

DETAILED DESCRIPTION OF THE INVENTION

Figure 1:
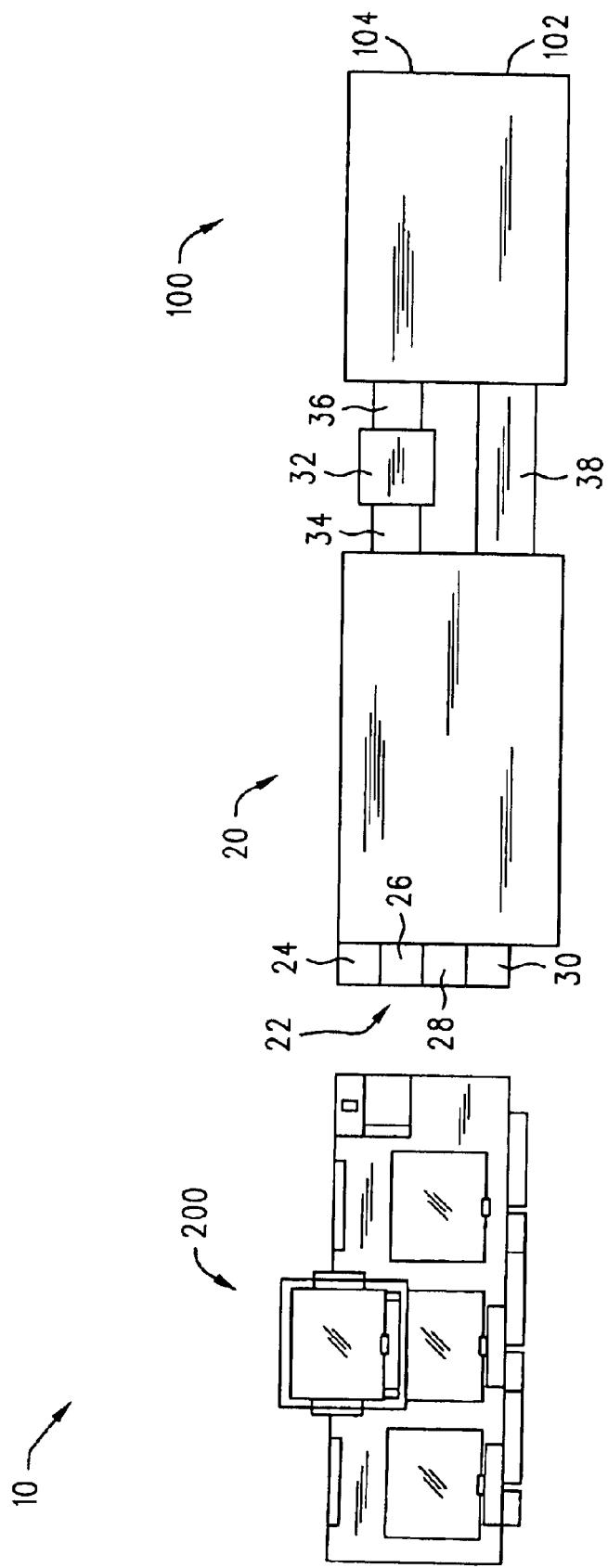
FIG. 1 is a schematic top plan view of an integrated circuit photolithographic manufacturing system.

FIGS. 1–21 in general, illustrate a method of manufacturing. The method includes the steps of: providing a manufacturing system 10 including at least one manufacturing process 20, 100 therein and providing a human interface device 200 operatively connected to the manufacturing system 10. The human interface device 200 may include at least a first station 210, associated therewith; at least a second station 240 associated therewith; and at least a first display device 214 associated therewith. The method further includes the steps of: providing at least one object 226 and at least one article corresponding to the at least one object; introducing the at least one article into the manufacturing system 10; placing the at least one object 226 onto the at least a first station 210 of the human interface device; and thereafter advancing the object 226 to the second station 240 of the human interface device 200 in response to the at least a first display device 214.

FIGS. 1–21 also illustrate, in general, a method of manufacturing comprising the steps of: providing a manufacturing system 10 including at least one manufacturing process 20, 100, therein; providing a human interface device 200 operatively connected with the manufacturing system 10; providing at least one object 226 located at the at human interface device 200; determining a first item of information by scanning at least a portion of the at least one object 226; obtaining at least one parameter depending upon the first item of information; and adjusting the at least one process 20, 100 according to the at least one parameter.

FIGS. 1–21 also illustrate, in general, a manufacturing system 10 for manufacturing integrated circuit devices. The manufacturing system includes at least a first manufacturing machine 20, 100; a human interface device 200 including at least a first station 210 associated therewith, at least a first display device 214 located adjacent the first station 210; at least a first scanning device 220 located adjacent the first station 210; a first controller 360 operatively connected to both the first display device 214 and the first scanning device 220; a second controller 170, 370 operatively connected to the at least a first manufacturing machine 20, 100; a data link 176, 372 connecting the first controller 360 and the second controller 170, 370.

Having thus described the apparatus and method in general, they will now be described in further detail.

FIG. 1 illustrates a photolithographic integrated circuit manufacturing system 10. Manufacturing system 10 may include a conventional resist spin track machine, schematically illustrated by the reference numeral 20. Resist spin track machine 20 may, for example, be of the type commercially available from Dainippon Screen Manufacturing Company of Kyoto, Japan and sold as a Model 80-B Spin Track.

Resist spin track machine 20 may include a plurality of indexers 22, such as the individual indexers 24, 26, 28 and 30. The indexers 22 serve to automatically unload individual wafers from their cassettes for processing and to reload the individual wafers into the cassettes after processing in a manner as previously described. Each of the indexers 22 may include a control panel and a start button, in a conventional manner.

With further reference to FIG. 1, manufacturing system 10 may further include a wafer stepper machine, schematically illustrated by the reference numeral 100. With the exception of certain improvements, as will be described in detail herein, wafer stepper machine 100 may be a conventional wafer stepper machine of the type, for example, commercially available from Nikon of Kumagaya, Japan and sold as NSR Model 12 Wafer Stepper.

A conventional buffer storage device 32 may be located downstream of the resist spin track machine 20 and upstream of the wafer stepper machine 100 as shown. Buffer storage device 32 may be connected to the resist spin track machine 20 via a conventional conveying device 34 and to the wafer stepper machine 100 via a conventional conveying device 36. Another conventional conveying device 38 may connect the wafer stepper machine 100 and the developer located within the resist spin track machine housing 20 as shown.

Manufacturing system 10 may further include an improved work-in-progress table 200, which will be described in further detail herein. Work-in-progress table 200 may be located adjacent the resist spin track machine 20. Work-in-place table 200 may also be referred to herein as a "WIP table".

The general product flow through the manufacturing system 10 will now be described. As previously pointed out, each lot of wafers is generally housed within a cassette which, in turn, is housed within a lot box, such as the lot box 226, FIG. 3. When a new lot box arrives for processing at the manufacturing system 10, it is placed on the WIP table 200. The new lot box is then opened and the cassette contained therein is removed from the box and placed on one of the indexers 22 of the resist spin track machine 20. When the resist spin track machine 20 is ready to begin processing the new lot, the indexer holding the new lot cassette begins removing wafers from the cassette and moving them into the resist spin track machine 20 for application of photo-resist material in a conventional manner.

After a wafer has completed processing in the resist spin track machine 20, it then is conveyed by the conveying device 34 out of the resist spin track machine 20. Thereafter, the wafer is conveyed into the wafer stepper machine 100 if the wafer stepper machine is ready to receive a wafer. If, however, the wafer stepper machine 100 is not ready to receive a wafer, then the wafer may be diverted to the buffer storage device 32 in a conventional manner.

After a wafer has been processed within the wafer stepper 100, it is then conveyed via the conveying device 38 into the developer. As previously described, the developer may be located within the same housing as the resist spin track machine 20. After processing is completed in the developer, the wafer is returned to its original cassette by the indexer. After all of the wafers in a particular lot have been returned to the lot cassette, the lot cassette may be returned to its lot box for subsequent processing at other manufacturing locations, in a manner as previously described.

Improved Wafer Stepper Reticle Library

As previously described, one problem with previous photolithographic integrated circuit manufacturing systems is that the wafer stepper must be manually advised as to the identity of the specific reticle located in each library slot. In order to address this problem, an improved wafer stepper library arrangement will now be described in detail.

Figure 2:
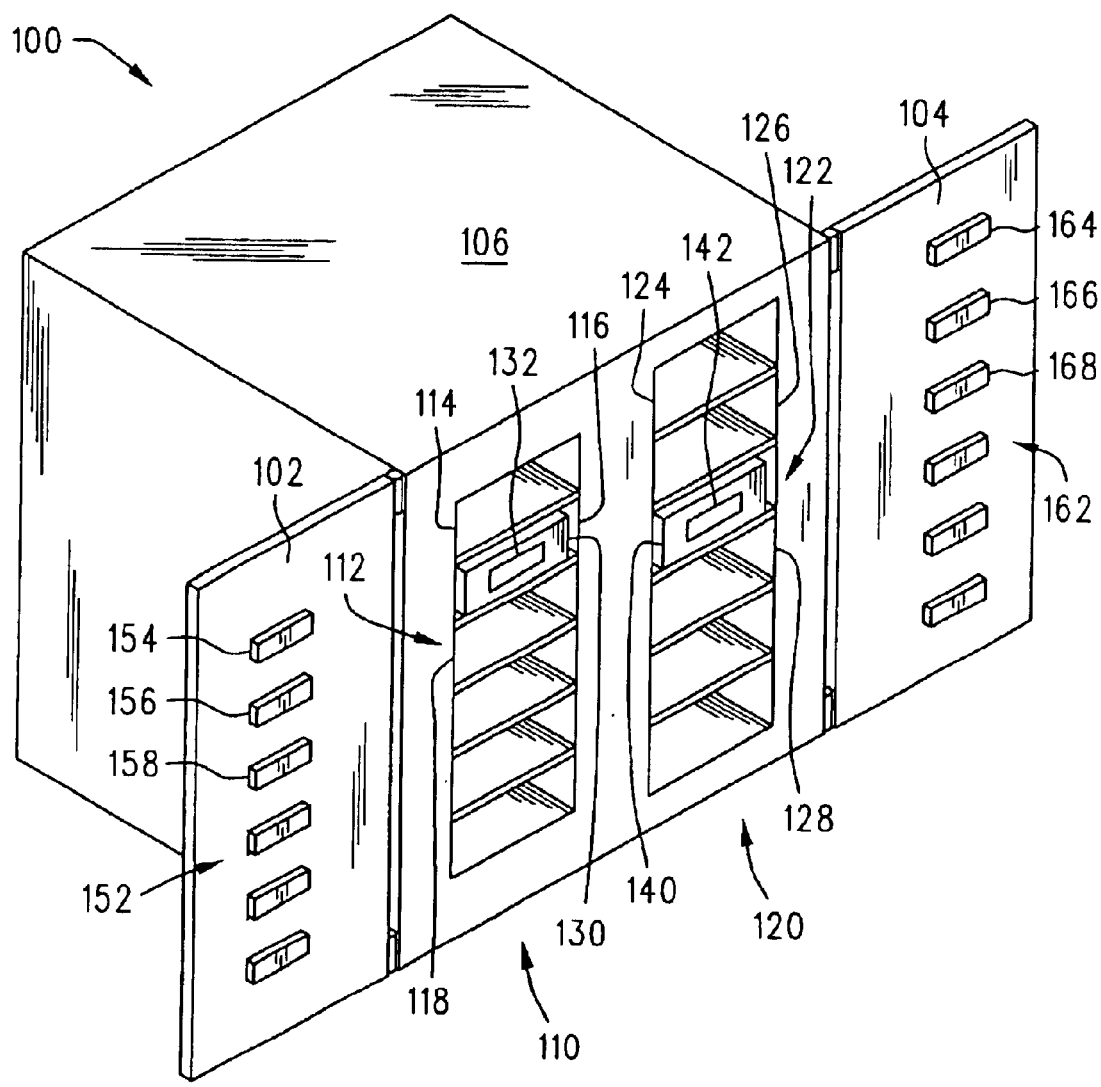
FIG. 2 is a perspective view of a wafer stepper machine used in the manufacturing system of FIG. 1.

FIG. 2 illustrates an improved wafer stepper machine 100 viewed from the outside thereof. Wafer stepper machine 100 may include a pair of library access doors 102, 104 (illustrated in the open position) which may be attached, e.g., via hinges, to the wafer stepper housing 106 in a conventional manner. A pair of reticle libraries 110, 120 may be located within the housing 106. Each of the reticle libraries may include a plurality of slots in a conventional manner. Reticle library 110, for example, may include slots 112, such as the individual slots 114, 116, 118. In a similar manner, reticle library 120 may, for example, include slots 122, such as the individual slots 124, 126, 128.

As previously described, the library slots 112, 122 are adapted to house reticle boxes therewithin, such as illustrated in FIG. 2 with respect to the reticle box 130 housed within the slot 116 and the reticle box 140 housed within the slot 128. It is noted that two separate libraries may be provided in order to accommodate different size reticles which are housed within different size reticle boxes in a conventional manner. Referring to FIG. 2, it can be seen, for example, that the slots 122 of the library 120, and the reticle box 140 located therein, are higher than the slots 112 of the library 110 and the reticle box 130.

During operation, a human operator is able to open the doors 102, 104 in order to gain access to the libraries 110, 120, respectively. After opening the appropriate door, the operator is able to insert or remove a reticle box from the library as desired. Once a reticle box has been inserted into a library slot, a conventional robotic device, not shown, within the wafer stepper is able to open the reticle box and remove the reticle therefrom. The robotic device then places the reticle into the wafer stepper projection device in order to expose integrated circuit layers with the appropriate pattern. After a particular lot of wafers has been completely processed, the robotic picker device then may return the reticle to its box and may select the next reticle from the library for use on the next lot of wafers in a conventional manner.

The provision of the libraries 110, 120, as described above, allows the reticle library to be conveniently preloaded with several reticles so that the appropriate reticle will be available when the corresponding wafer lot arrives at the wafer stepper. As previously described, however, in prior wafer stepper machines, it is necessary that a human operator identify the library slot in which the desired reticle is located and convey this information to the wafer stepper controller. This identification process has been prone to error. As can be appreciated, such error may result in the wrong reticle being used and, accordingly, contributes to scrap and/or rework.

To overcome this problem, the wafer stepper machine 100 has been modified in a manner as will now be described in detail. Referring again to FIG. 2, each reticle box used in conjunction with the wafer stepper 100 may be provided with indicia, such as a barcode label, indicative of the identification number of the reticle housed therewithin. Reticle box 130, for example, may be provided with a barcode label 132 and reticle box 140 may be provided with a barcode label 142 as shown in FIG. 2.

The access door 102 of the wafer stepper machine 100 may be provided with indicia reading devices, e.g., barcode readers, such that one indicia reading device is provided for each of the slots 112 of the library 110. Access door 102 may, for example, be provided with barcode readers 152, such as the individual barcode readers 154, 156 and 158. In a similar manner, the access door 104 of the wafer stepper machine 100 may be provided with indicia reading devices, e.g., barcode readers, such that one indicia reading device is provided for each of the slots 122 of the library 120. Access door 104 may, for example, be provided with barcode readers 162 such as the individual barcode readers 164, 166 and 168.

The barcode readers 152, 162 may be positioned on the respective access doors 102, 104 such that, when the access doors 102, 104 are closed, the barcode readers 152, 162 will align with the barcode labels on reticle boxes housed within the slots 112, 122, respectively. Specifically, for example, when the access door 102 is closed, the barcode reader 156 will align with the barcode label 132 on the reticle box 130 located in the slot 116 of the library 110. In a similar manner, when the access door 104 is closed, the barcode reader 168 will align with the barcode label 142 on the reticle box 140 located in the slot 128 of the library 120.

Figure 5:
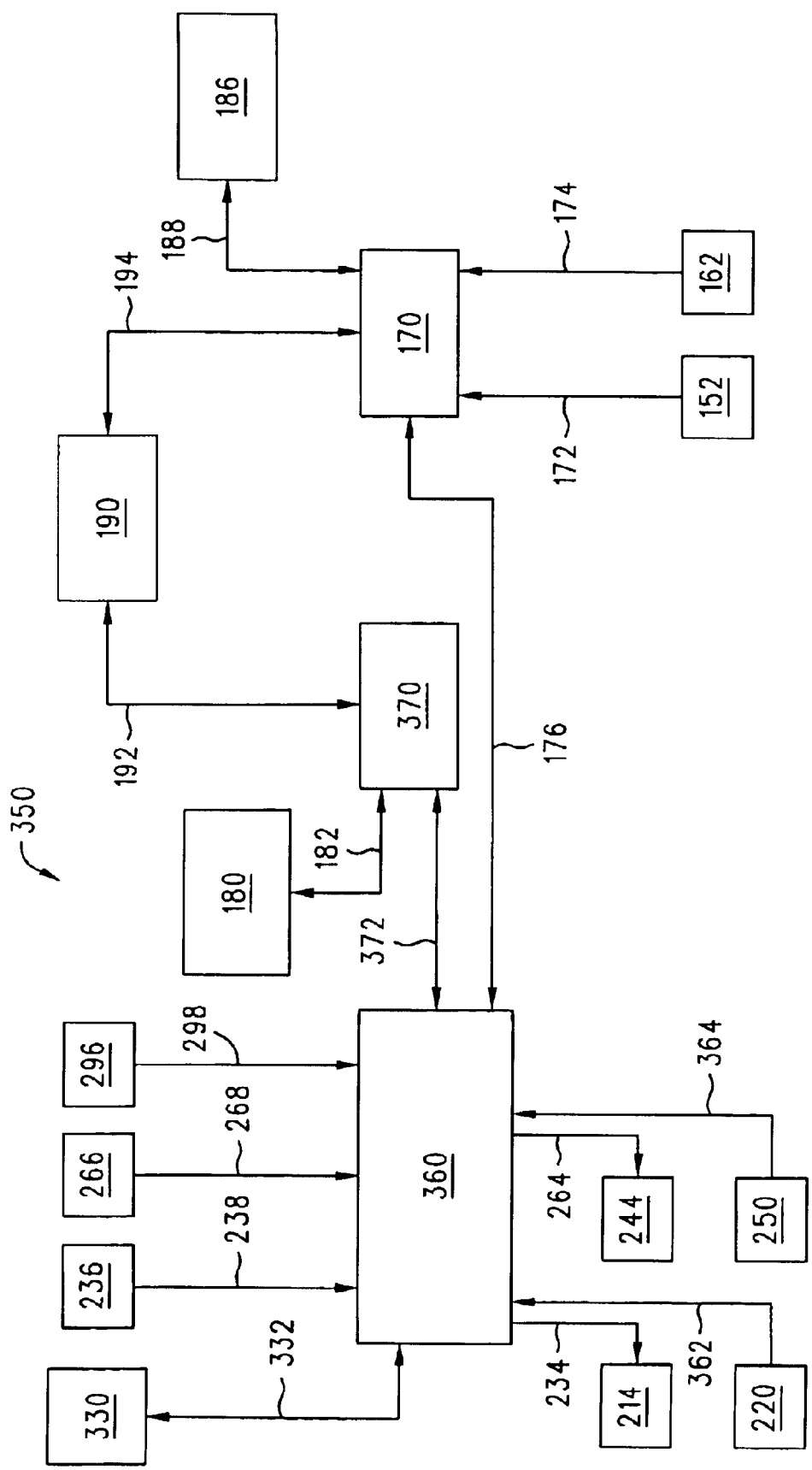
FIG. 5 is a schematic diagram depicting the control system for the manufacturing system of FIG. 1.

The use of indicia and indicia reading devices, as described above, allows the wafer stepper machine 100 to determine the correct slot location for the required reticle, thus eliminating the need for a human operator to provide this information. Referring to FIG. 5, for example, the wafer stepper controller 170 may be attached to the indicia reading devices 152 via a data link 172 and to the indicia reading devices 162 via a data link 174. Each time that the wafer stepper machine 100 is set up for a new lot of wafers, the controller 172 may activate the indicia reading devices 152, 162 in order to scan for the desired reticle box number. As can be appreciated, the controller 170 is able to determine the slot in which the desired reticle box is located based upon the specific indicia reading device which located the desired reticle box number. Referring again to FIG. 2, if, for example, the reticle box 130 contains the desired reticle, then the controller can determine that the second slot in library 110, i.e., the slot 116, contains the desired reticle. The controller may then cause the robotic picker to remove the reticle from the reticle box located in slot 116 in order to set up the next wafer lot.

If the reading devices 152, 162 fail to reveal the desired reticle box, this indicates that the necessary reticle has not been added to the library. In this case, machine operation may be halted and an alarm sounded to alert a human operator of the problem. The operation described above is illustrated in flowchart from within FIG. 21.

Indicia reading devices 152, 162 may be any conventional type of indicia reading devices and may, for example, be barcode reading devices of the type commercially available from Microscan Systems, Inc. of Renton, Wash. and sold as a Series 710 Barcode Scanner.

The indicia, such as the indicia 132, 142, FIG. 2, may be any conventional type of indicia and may, for example, be conventional barcode labels.

Other than the addition of the indicia reading devices 152, 162, indicia (such as the indicia 132, 142) and the control system described in conjunction with FIG. 5 above, wafer stepper machine 100 may be a conventional wafer stepper machine, as previously described.

It is noted that FIG. 2 illustrates an indicia reading device used in conjunction with each library slot. If, however, less slots are required for a particular operating environment, some of the library slots may designated as inactive and physically blocked off to prevent their use. Indicia reading devices may be omitted for these inactive slots. In this manner, an indicia reading device will still be provided for each active slot; however, the overall number of indicia reading devices required may be reduced. In a preferred embodiment, for example, each of the libraries 110, 120 may have all but three slots designated as inactive.

Improved Manufacturing System Control

As previously described, the operation and control of conventional photolithographic manufacturing systems has resulted in several undesirable operating characteristics. One such undesirable characteristic is the mis-entry of information. Specifically, the necessity for human operators to manually look up and enter data (e.g., the recipe number for the resist spin track machine and the reticle, focus and exposure time data for the wafer stepper machine) commonly results in mis-processing due to errors in either obtaining the proper data, in transferring the proper data to the appropriate machine, or both. Such mis-processing, in turn, results in the need to rework material and/or scrapped product.

Another undesirable characteristic associated with conventional systems relates to the fact that it is an asynchronous process. Specifically, human operator interface is required at random times in order to keep the process in operation. With reference to FIG. 1, after the wafer stepper machine 100 completes a lot, for example, an end of lot signal is produced by the wafer stepper machine 100. This end of lot signal, in turn, causes an alarm to be activated. Human input is required, in response to this alarm, before the wafer stepper may begin processing the next lot. As described above, the human operator must look up the parameters for the next lot and enter these parameters into the control system for the wafer stepper machine. If a human operator is not available when the wafer stepper machine 100 finishes a lot, then the wafer stepper machine will sit idle until a human operator becomes available and completes the data entry task. This results in undesirable equipment downtime and, consequently, a loss of production efficiency for the photolithographic process. Compounding this problem is the fact that a typical photolithographic manufacturing facility may include multiple (e.g., 12) sets of resist spin track/ wafer stepper machine combinations. The use of such multiple sets increases the likelihood that the human operator or operators will be otherwise occupied when a particular wafer stepper completes a lot.

FIG. 5 schematically illustrates an improved controller for the photolithographic manufacturing system 10 which overcomes the problems described above. The improved control system 350 operates in conjunction with the improved WIP table 200, FIGS. 1, 3 and 4, in a manner as will now be described in detail.

Figure 3:
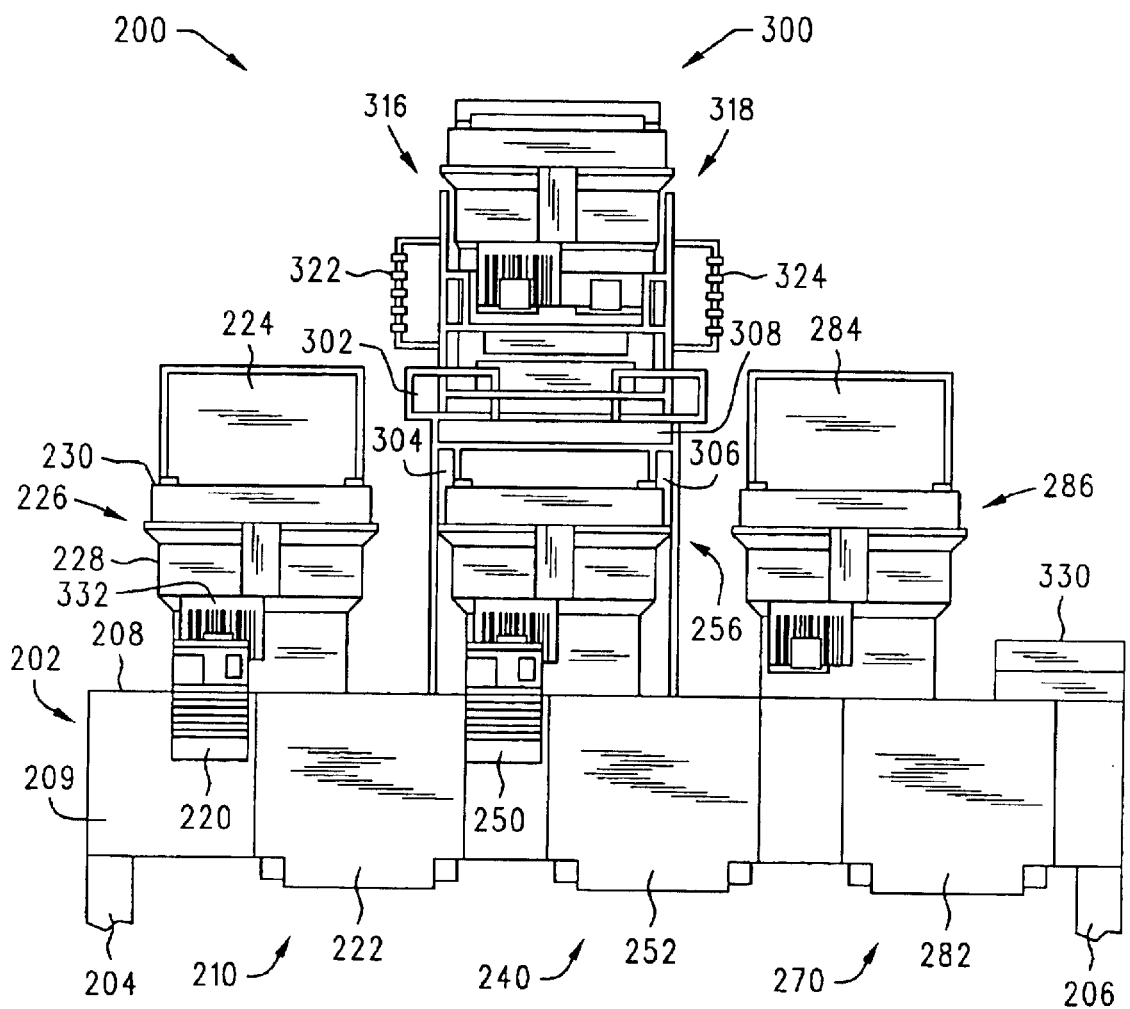
FIG. 3 is a front elevation view of a work in progress table used in the manufacturing system of FIG. 1, with lot boxes in place.

Referring to FIG. 3, WIP table 200 may include an upper table portion 202 which is supported by a plurality, e.g., four, legs, such as the legs 204, 206 in a conventional manner. Upper table portion 202 includes an upper surface 208 and a front surface 209 as shown.

Figure 4:
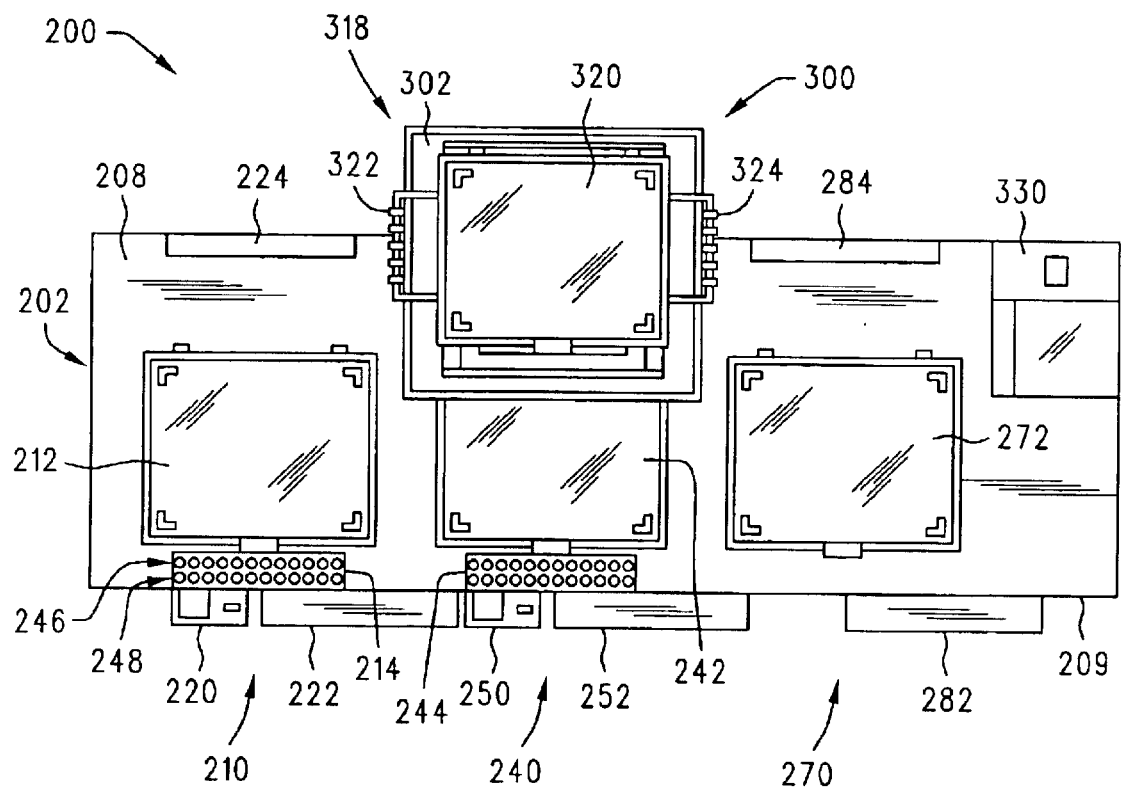
FIG. 4 is a top plan view of the table of FIG. 3 with the lot boxes omitted.

Referring to FIGS. 3 and 4, WIP table 200 includes a plurality of stations, specifically a resist spin track station 210, a wafer stepper station 240 and a developer station 270. For system control purposes, as will be explained in more detail herein, resist spin track station 210 corresponds to the resist spin track machine 20, FIG. 1, wafer stepper station 240 corresponds to the wafer stepper machine 100 and developer station 270 corresponds to the developer as previously described.

Resist spin track station 210 may generally include a lot box nest 212 and a display device 214, both attached to the upper surface 208 of the WIP table upper portion 202, FIG. 4. Resist spin track station 210 may also include a barcode reader 220 and a paperwork bin 222, FIGS. 3 and 4, both attached to the front surface 209 of the WIP table upper portion 202. Resist spin track station 210 may also include a backstop member 224 extending upwardly from the upper surface 208 of the WIP table upper portion as shown in FIGS. 3 and 4.

Wafer stepper station 240 may generally include a lot box nest 242 and a display device 244, both attached to the upper surface 208 of the WIP table upper portion 202, FIG. 4.

Stepper station 240 may also include a barcode reader 250 and a paperwork bin 252, FIGS. 3 and 4, both attached to the front surface 209 of the WIP table upper portion 202.

Developer station 270 may generally include a lot box nest 272 attached to the upper surface 208 of the WIP table upper portion 202, FIG. 4. Developer station 270 may also include a paperwork bin 282, FIGS. 3 and 4, attached to the front surface 209 of the WIP table upper portion 202. Developer station 270 may also include a backstop member 284 extending upwardly from the upper surface 208 of the WIP table upper portion as shown in FIGS. 3 and 4.

The barcode readers 220 and 250 may be any conventional type of barcode reading devices and may, for example, be of the type commercially available from Symbol of Bohemia, N.Y. and sold as a Model LS1220 Barcode Scanner.

Display devices 214 and 244 may each include a first and a second set of lights, for example the first and second sets 216, 218 of lights illustrated in FIG. 4 with respect to the display device 214. First set 216 may, for example, consist of red lights while second set 218 may, for example, consist of green lights. As can be appreciated from the above, the display devices 214, 244 are generally capable of generating either a red display, a green display or no display at all. Referring to FIG. 5, the display devices 214, 244 may be connected to WIP table controller 360 via the connections 234, 264, respectively.

Display devices 214, 244 may be any conventional type of display devices, e.g., conventional LED display devices.

Referring again to FIGS. 3 and 4, WIP table 200 may further include a fourth station 300 which may be designated as a "next lots" station. Next lot station 300 may include a horizontally extending pan member 302 which may be supported by a pair of upright members 304, 306 attached to the upper table portion 202 and connected by a cross member 308.

Referring to FIGS. 3 and 4, each of the WIP table nests 212, 242 and 272, FIG. 4, may be adapted to receive and locate a conventional wafer lot box. Such lot boxes are used to house wafer cassettes in a manner as previously described. FIG. 3 illustrates a lot box 226 received within the nest 212, a lot box 256 received within the nest 242 and a lot box 286 received within the nest 272. Each of the lot boxes may include a bottom portion and a lid member in a conventional manner, such as the bottom portion 228 and lid member 230 of the lot box 226. When the lids of the lot boxes 226 and 286 are opened, the backstops 224, 284, previously described with respect to the resist spin track station 210 and the developer station 270, respectively, support the lids and prevent the lot boxes from toppling backwards. When the lid of the lot box 256 is opened, the uprights 304, 306 and the cross member 308 supports the lid of the lot box 256.

A microswitch 236, FIG. 5, may be located beneath the nest 212, FIG. 4, such that the microswitch will be moved to a closed position by the weight of a lot box in the nest 212 and will assume an open position when no lot box is located within the nest 212. In a similar manner, microswitches 266 and 296 may be located beneath the nests 242, 272, respectively. As shown in FIG. 5, each of the microswitches 236, 266, 296 is connected to the WIP table controller 360 via connections 238, 268, 298, respectively. In this manner, the WIP table controller 360 is able to sense whether a lot box is present in each of the nests 212, 242, 272.

A barcode label may be located on the bottom portion of each lot box, such as the barcode label 232 located on the bottom portion 228 of the lot box 226, FIG. 3. The barcode label on each lot box may include a number which identifies the wafer lot contained within the box. As can be appreciated with reference to FIG. 3, when a lot box is located within one of the nests 212, 242 the barcode label located on the lot box will be aligned with and, thus, readable by the corresponding barcode reader 220, 250, respectively. In this manner, the WIP table controller 360, FIG. 5, is able to monitor which lot box is in each of the WIP table nests 212, 242. Specifically, with continued reference to FIG. 5, the controller 360 is able to determine the lot number of the lot box located in the nest 212 via the barcode reader 220 and the data link 362. The controller 360 is also able to determine the lot number of the lot box located in the nest 242 via the barcode reader 250 and the data link 364.

Referring to FIG. 4, WIP table 200 may further include an operator interface panel 330 which may provide information to a human operator and allow the operator to control the process. Interface panel 330 may include various lights and/or audible alarms to alert an operator when an error condition occurs. An example of such an error condition is a failed read by one of the barcode readers 220, 250. Interface panel 330 may also include various buttons or switches which may be activated by a human operator. Examples of functions activated by such buttons or switches include power on and power off, release of a lot from the system, erasure of a lot from the system and system reset. Referring to FIG. 5, interface panel 330 may be connected to the WIP table controller 360 via a data link 332.

Referring again to FIG. 5, the WIP table controller 360 may be connected to a resist spin track machine controller 370 via a data link 372. Resist spin track machine controller 370 generally controls the resist spin track machine 20 (including the developer, as previously described) and the adjacent indexers 22, FIG. 1. Resist spin track machine controller, in turn, is connected to the main manufacturing system controller 190 via a data link 192. Main manufacturing system controller 190 controls the overall integrated circuit manufacturing environment and, for example, tracks the current mask level of each wafer lot. Resist spin track machine controller 370 is also connected, via a data link 182, to a resist spin track parameter database 180.

WIP table controller 360 is connected to the wafer stepper machine controller 170 via a data link 176. Wafer stepper machine controller 170, in turn, is connected to the main manufacturing system controller 190 via a data link 194. Wafer stepper controller 170 is also connected to a wafer stepper parameter database 186 via a data link 188.

WIP table 200, in conjunction with the WIP table controller 360, provides a visual gating system for controlling the overall operation of the manufacturing system 10. As will be explained in further detail herein, the stations of the WIP table 200 are used to set up parameters in the corresponding manufacturing system machines. Specifically, as the manufacturing process progresses, a human operator may move lot boxes from left to right, as viewed in FIG. 3, from one nest to the next. The lot box 286, for example would be removed from the table, the lot box 256 moved to the nest 272, the lot box 226 moved to the nest 242, a new lot box moved into the nest 212 and so on. The display devices 214, 244 serve to advise a human operator as to when the lot boxes may be advanced. Specifically, when a green light is exhibited, a human operator may move the lot box from that position. When a red light is exhibited, however, the lot box in that position may not be moved.

Referring again to FIGS. 3 and 4, it is noted that the next lot station 300 does not form a part of the visual gating control system. Rather, next lot station 300 merely represents a convenient holding place for the next wafer lot to enter the system. When a new wafer lot box, such as the lot box 316, FIG. 3, arrives at the photolithographic manufacturing system 10, it may be housed within a tote 318. Tote 318 may include a lot box nest 320, FIG. 4, adapted to house a lot box, as shown, for example, with respect to the lot box 316 housed within the nest 320 in FIG. 3. Tote 318 may also include a pair of handles 322, 324, to facilitate carrying the tote. In addition to a lot box, the tote may also carry other items such as the reticle to be used in the wafer stepper machine for the lot carried by the tote and paperwork relating to the lot. When a tote, housing a new lot box, arrives at the WIP table 200, it may be placed within the pan 302 previously described. At this time, the reticle may be removed from the tote and placed within one of the wafer stepper libraries 110, 120, in a manner as previously described, so that the reticle will be available for use by the wafer stepper machine 100 when wafers from the lot ultimately reach the wafer stepper machine. At this time, the paper work and other items may be removed from the tote as well.

When the WIP table nest 212 becomes available, the lot box 316 may be moved from the tote to the nest 212. The tote 318 may then be removed from the WIP table pan 302 and recycled.

SYSTEM OPERATION

As previously described, WIP table 200 supplies lot number input to both the resist spin track machine 20 and the wafer stepper machine 100 while providing a visual gating system for a human operator. The function of this system will now be described from the perspective of the WIP table resist spin track station 210, the WIP table wafer stepper station 240, the resist spin track controller 370 and the wafer stepper controller 170.

With respect to the WIP table resist spin track station 210, the WIP table process begins when a lot box is placed in the nest 212. The presence of the lot box is detected by the WIP table controller 360 via the microswitch 236 located beneath the nest 212 as previously described. Upon detecting the presence of a lot box in the nest 212, the WIP table controller 360 activates the scanning device 220 in order to determine the lot number of the new lot box in the nest 212. This new lot number is then stored in a history file which is maintained and constantly updated in order to track the current condition of the WIP table 200. Specifically, the new lot number for the lot box in the nest 212 will be stored in a resist spin track area of the history file.

The WIP table controller 360 then sets the display device 214 to red and waits to receive a query from the resist spin track machine controller 370. When the query arrives, the WIP table controller 360 sends the new resist spin track lot number (from the resist spin track area of the history file) to the resist spin track controller 360. Thereafter, the WIP table controller 360 waits to receive a signal from the resist spin track machine controller 370 indicating that the start button on the resist spin track indexer has been depressed by a human operator. Upon receiving this signal, the WIP station controller 360 sets the display device 214 to green.

Figure 18:
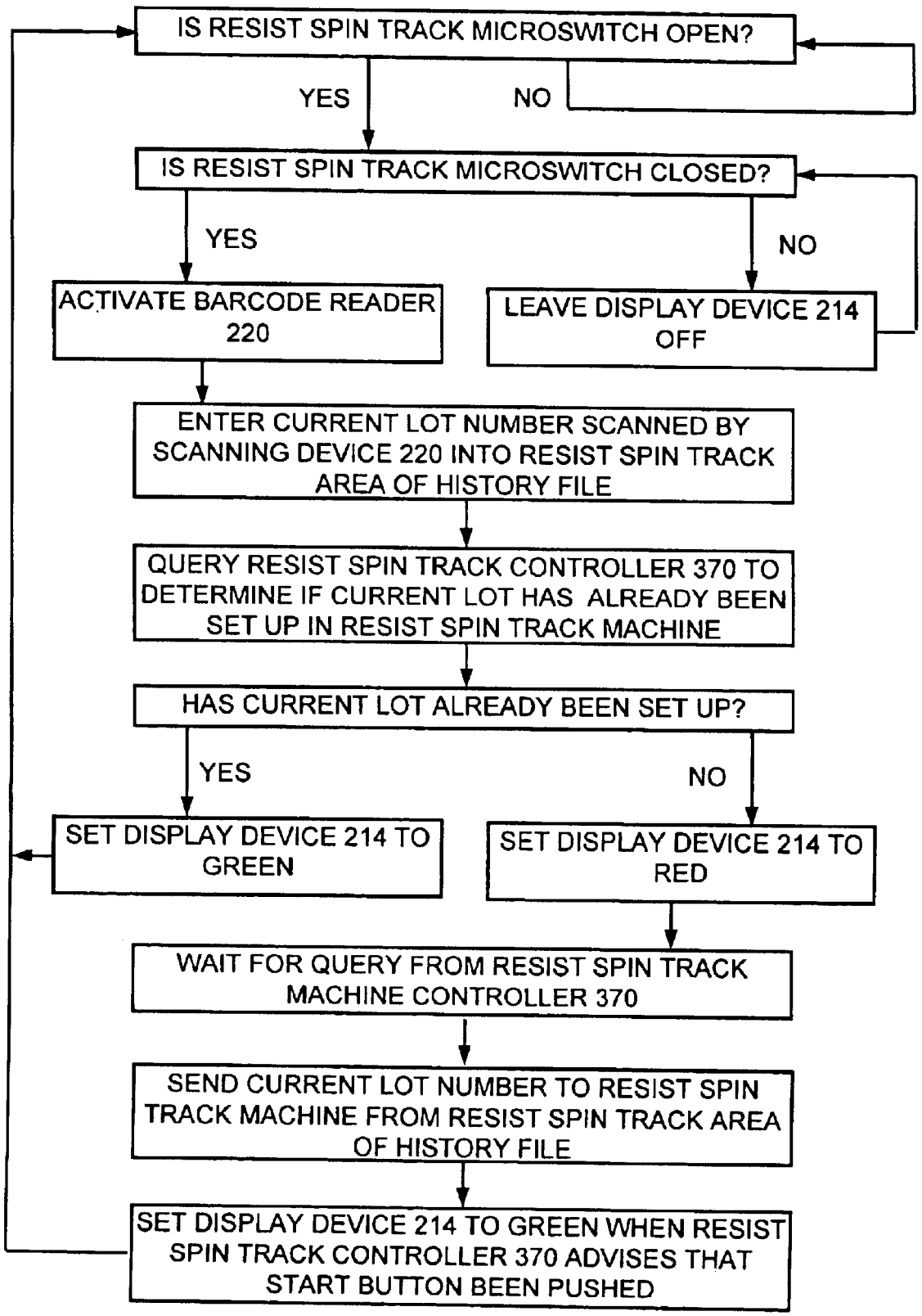
FIG. 18 is a flowchart illustrating the operation of the manufacturing system of FIG. 1 from the perspective of the resist spin track station of the work in progress table of FIGS. 3 and 4.

FIG. 18 illustrates, in flowchart form, the operation of the WIP table controller 360 with respect to the resist spin track station 210, as outlined above. It is noted that, as illustrated in FIG. 18, the controller 360 may initially check to determine whether the new lot number scanned is, in fact, a new lot number or whether it is a lot number already set up in the resist spin track machine. This check is performed since lot boxes are sometimes bumped or jarred on the WIP table 200, thus causing a momentary opening and closing of the microswitch. The check verifies whether a new lot box has been added or a pre-existing lot box was merely jarred. Although this procedure is illustrated only at the beginning of the process in FIG. 18, it is to be understood that it may be practiced at all phases of operation.

With respect to the WIP table wafer stepper station 240, the WIP table process begins when a lot box is placed in the nest 242. The presence of the lot box is detected by the WIP table controller 360 via the microswitch 266 located beneath the nest 242 as previously described. Upon detecting the presence of a lot box in the nest 242, the WIP table controller 360 activates the scanning device 250 in order to determine the lot number of the new lot box. This new lot number is then stored in the history file as described above with respect to the resist spin track station 210. Specifically, the new lot number for the lot box in the nest 242 will be stored in a wafer stepper area of the history file. The WIP table controller 360 then sets the display device 244 to red. The WIP table controller 360 also immediately sends the new lot number to the wafer stepper controller 170. If the wafer stepper machine 100 is idle when the new lot number is sent, then the wafer stepper controller will accept and begin setting up the wafer stepper machine with the new lot number in a manner as will be described in further detail herein. If, however, the wafer stepper machine is busy (i.e., processing another lot of wafers) at the time that the new lot number arrives from the WIP table controller 360, then the new lot number will be ignored by the wafer stepper controller.

If the new lot number is ignored by the wafer stepper controller 170 (i.e., because the wafer stepper machine 100 was busy when the new lot number was sent), then the WIP table controller 360 waits to receive an end of lot signal indicating that the wafer stepper machine 100 has completed processing its current lot. Conventional wafer stepper machines typically generate a signal when the processing of a lot has been completed within the wafer stepper machine. Previously, this signal was used to alert a human operator, e.g., via an alarm device, that a lot had completed processing. In response to this alarm, the human operator would be required to enter wafer stepper setup parameter data before the next lot could begin processing within the wafer stepper machine.

The wafer stepper controller 170 may sense the signal generated by the wafer stepper machine and send an end of lot signal on to the WIP table controller 360. Alternatively, and preferably, however, the WIP table controller 360 may directly sense the signal generated by the wafer stepper machine 100 to derive the end of lot signal.

When the end of lot signal arrives at the WIP table controller 360, the WIP table controller sends the new wafer stepper lot number (from the wafer stepper area of the history file) to the wafer stepper controller 170. Thereafter, the WIP table controller 360 waits to receive a signal from the wafer stepper machine controller 170 indicating that the first wafer from the new lot has been successfully processed in the wafer stepper machine 100. Upon receiving this signal, the WIP station controller 360 sets the display device 244 to green.

Figure 19:
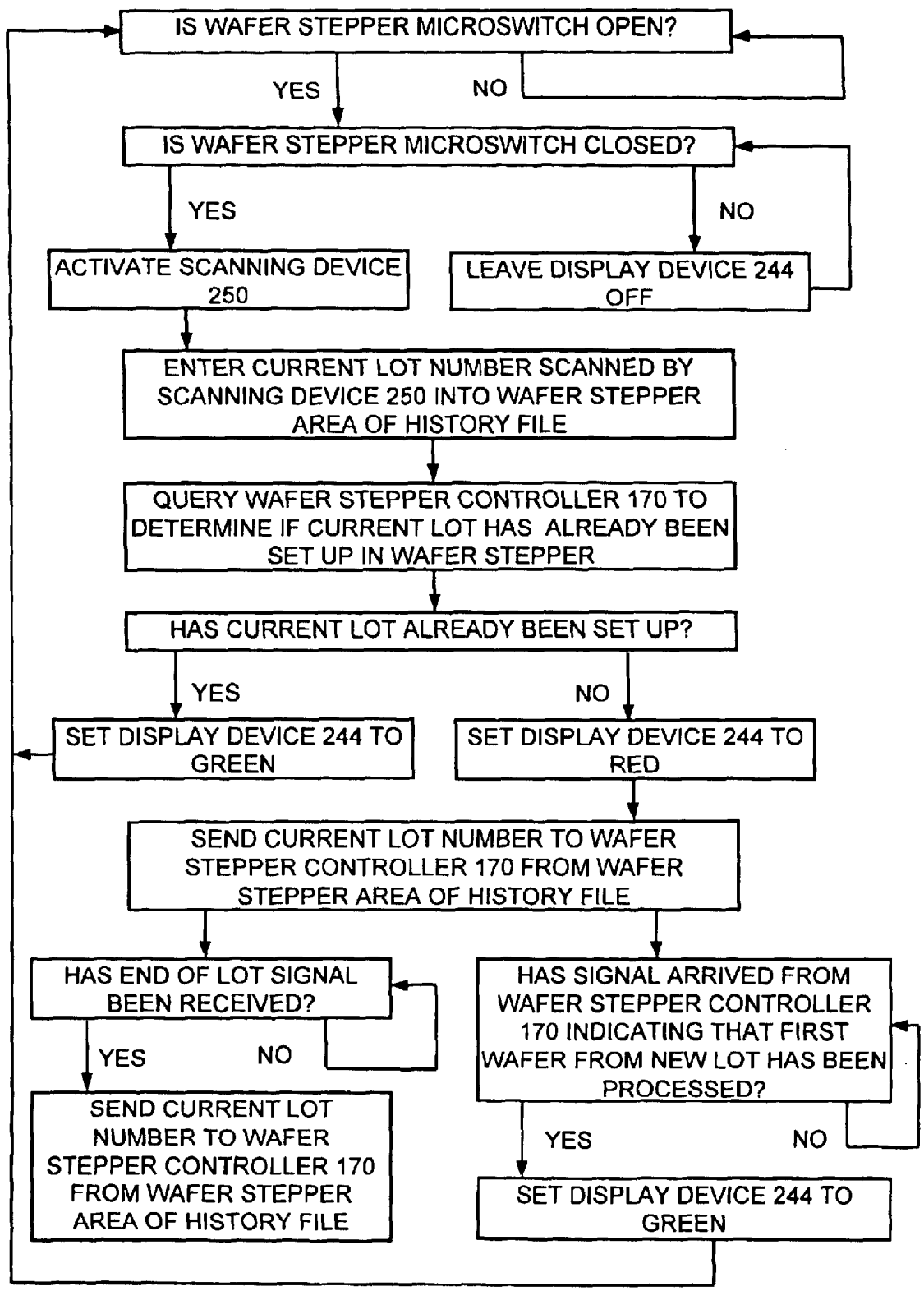
FIG. 19 is a flowchart illustrating the operation of the manufacturing system of FIG. 1 from the perspective of the wafer stepper station of the work in progress table of FIGS. 3 and 4.

FIG. 19 illustrates, in flowchart form, the operation of the WIP table controller 360 with respect to the wafer stepper station 240, as outlined above. In a similar manner to that described above with respect to FIG. 18, in FIG. 19 the controller 360 will initially check to determine whether the new lot number scanned is, in fact, a new lot number or whether it is a lot number already set up in the resist spin track machine. Although this procedure is illustrated only at the beginning of the process in FIG. 19, it is to be understood that it may be practiced at all phases of operation.

It is noted that, although the developer station 270, e.g., FIG. 4, does not include a barcode reader, it does include a microswitch 296, FIG. 5, in a manner as previously described. Accordingly, the WIP table controller 360 is able to sense the presence of a lot box within the developer nest 272. Since there is no barcode scanner associated with the station 270, the WIP table controller 360 assumes that a lot box arriving in the nest 272 is the same lot box which previously resided in the nest 242.

With respect to the resist spin track controller 370, the process begins when a new lot cassette is placed on one of the indexers 22. Upon detecting the presence of the new lot cassette, the resist spin track controller 370 will query the WIP table controller 360 in order to determine the lot number of the new lot (as stored in the resist spin track area of the history file). After obtaining the new lot number, the resist spin track controller 370 then queries the main system controller 190 to determine the mask level of the new lot and then queries the resist spin track parameter database 180 to determine the recipe number required for the new lot and mask level. The resist spin track controller 370 then selects the appropriate recipe number on the indexer holding the new cassette. When the resist spin track machine 100 is ready to begin processing the new lot, the indexer will set up the resist spin track machine 20 to perform the selected recipe.

Figure 20:
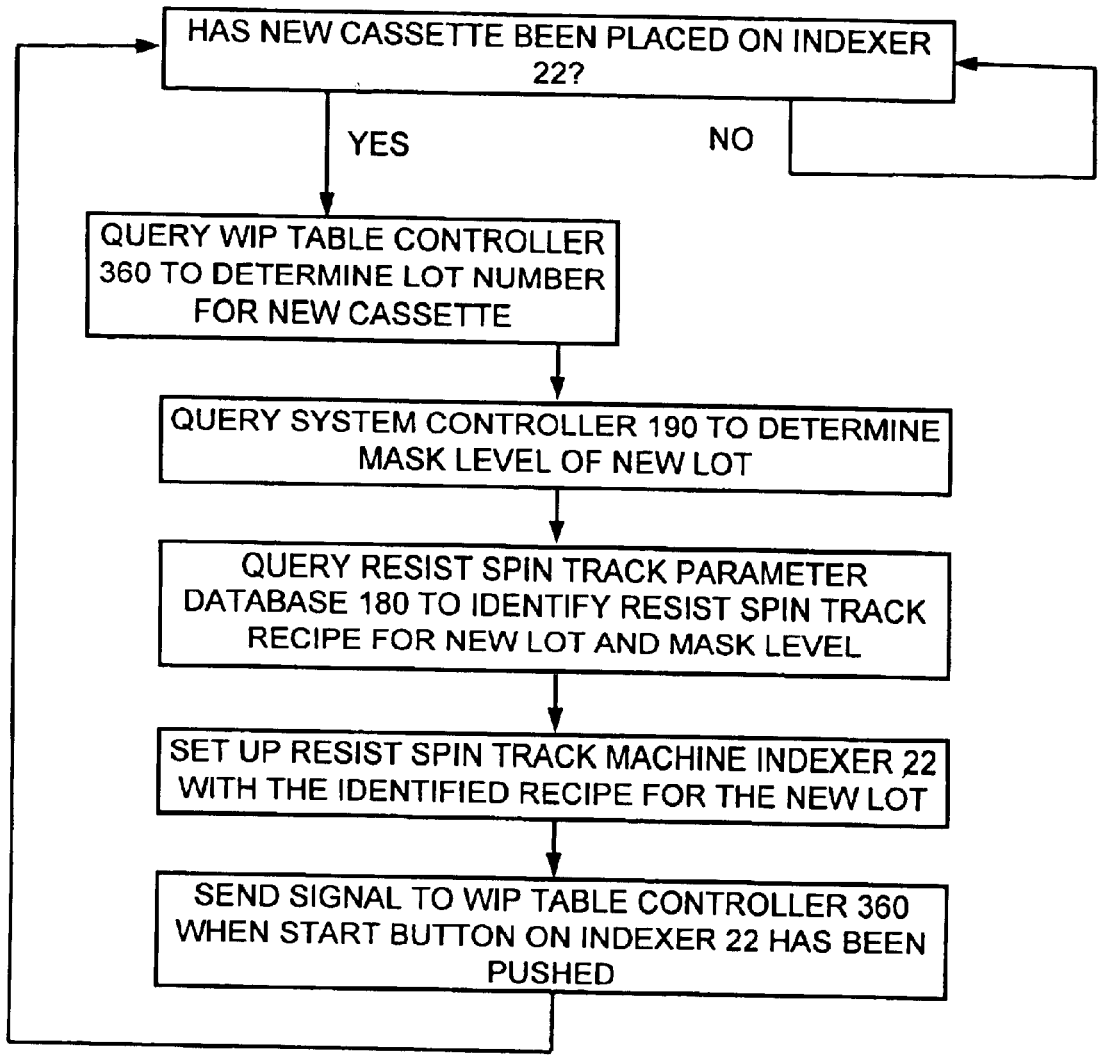
FIG. 20 is a flowchart illustrating the operation of the manufacturing system of FIG. 1 from the perspective of the resist spin track machine controller.

When a human operator presses the start button on the indexer, the resist spin track machine controller 370 will send a signal to the WIP table controller 360. In response to this signal, the WIP table controller will set the display device 214 from red to green in a manner as more fully described herein. FIG. 20 illustrates, in flowchart form, the operation of the resist spin track controller as outlined above.

With respect to the wafer stepper controller 170, when a lot has completed processing in the wafer stepper machine 100, an end of lot signal will be sent to the WIP table controller 360 either from the wafer stepper controller 170 or directly from the wafer stepper machine 100, itself, in a manner as previously described. The wafer stepper controller 170 will then await a new wafer stepper lot number from the WIP table controller 360. When the new lot number arrives (from the wafer stepper area of the history file), the wafer stepper controller 170 then queries the main system controller 190 to determine the mask level of the new lot and the required reticle identification number and then queries the wafer stepper parameter database 186 to determine other setup parameters, such as focus and exposure data for the new lot and mask level.

The wafer stepper controller 170 then performs a scan of the wafer stepper libraries 110, 120 for the specified reticle number using the reading devices 152, 162 in a manner as previously described. If the specified reticle number is not found by the scan, then an alarm is sounded in order to alert a human operator that the required reticle is not in the library. If the specified reticle is found, then the wafer stepper controller 170 identifies the library slot number in which the reticle is located. The wafer stepper controller then uses the reticle slot number, along with the other identified wafer stepper parameters to set up the wafer stepper machine 100.

Figure 21:
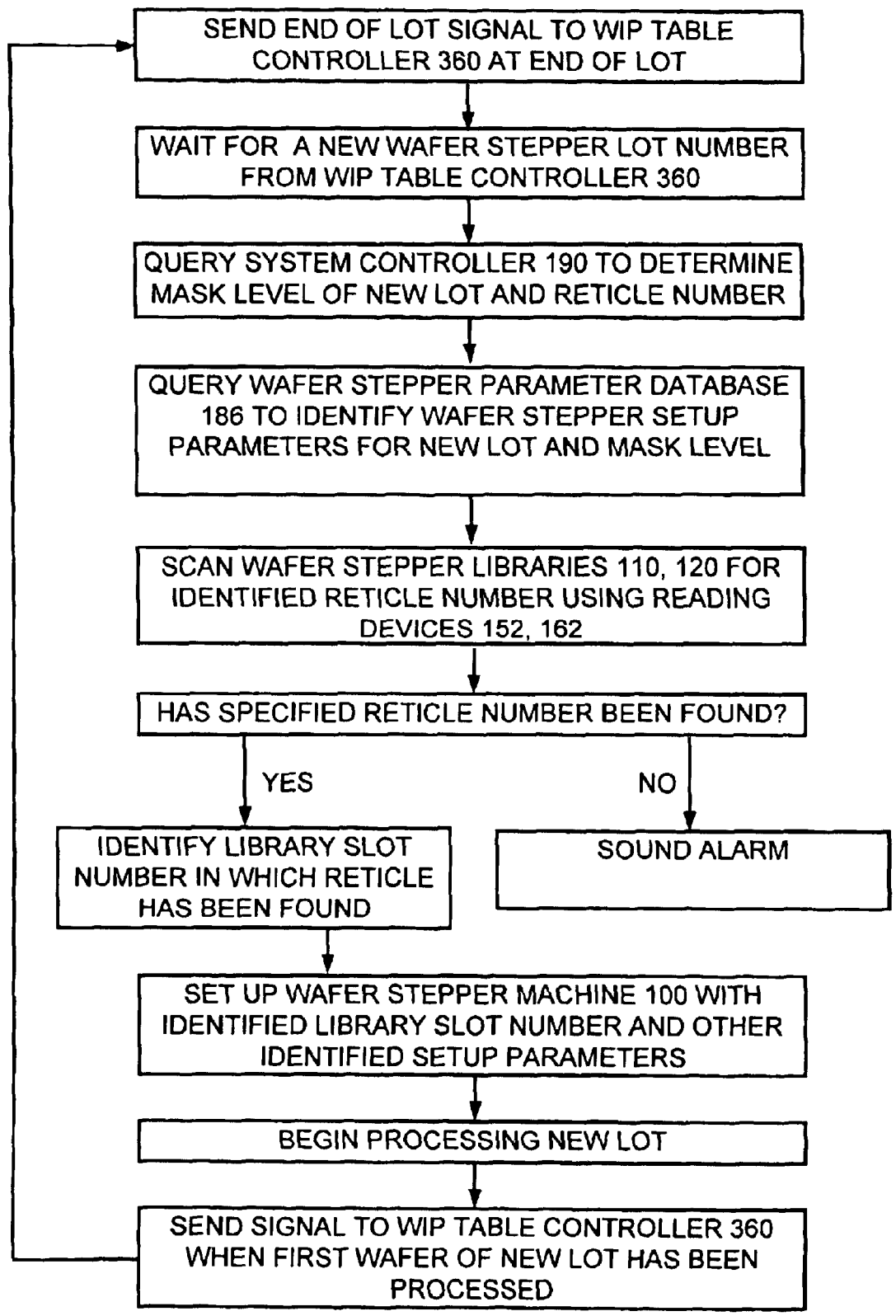
FIG. 21 is a flowchart illustrating the operation of the manufacturing system of FIG. 1 from the perspective of the wafer stepper machine controller.

After the wafer stepper machine is set up, processing of the new lot of wafers is automatically begun. After the first wafer is successfully processed, the wafer stepper controller 170 sends a signal indicative of this fact to the WIP table controller 360. FIG. 21 illustrates, in flowchart form, the operation of the wafer stepper controller 170 as outlined above.

It is noted that the wafer stepper controller 170 may also automatically perform a test known in the industry as a "particle on chuck" test. A particle on chuck test is typically run between lots in the wafer stepper machine 100 to ensure that the chuck that holds a wafer during processing is clean. In prior wafer stepper machines, this test had to be initiated manually by a human operator. In the present system, however, the wafer stepper controller 170 may automatically cause the test to be performed, e.g., after every three lots have been processed in the wafer stepper machine.

The operation of the WIP table 200 will now be described in detail with respect to a specific sequence of operations. It is noted that the described sequence of operations is set forth by way of example only; in operation of the WIP table 200, other operating sequences are possible.

FIGS. 6–17 illustrate a sequence of operational steps relating to the WIP table 200. FIGS. 6–17 schematically illustrate the WIP table 200, including the first, second and third station lot box nests 212, 242, 272, respectively, the first station display device 214 and the second station display device 244. Also illustrated schematically are the resist spin track machine 20, the buffer storage device 32, the wafer stepper machine 100, the developer (which, as previously described, may be enclosed within the same housing as the resist spin track machine 20) and the indexers 22.

To facilitate illustration in FIGS. 6–17, the resist spin track station (nest 212 and display device 214) is labeled "RST", the wafer stepper station (nest 242 and display device 244) is labeled "WS", the developer station (nest 272) is labeled "DEVELOPER", the resist spin track machine 20 is labeled "RESIST SPIN TRACK MACHINE", the wafer stepper machine 100 is labeled "WAFER STEPPER" and the developer is labeled "DEVELOPER MACHINE".

Figure 6:
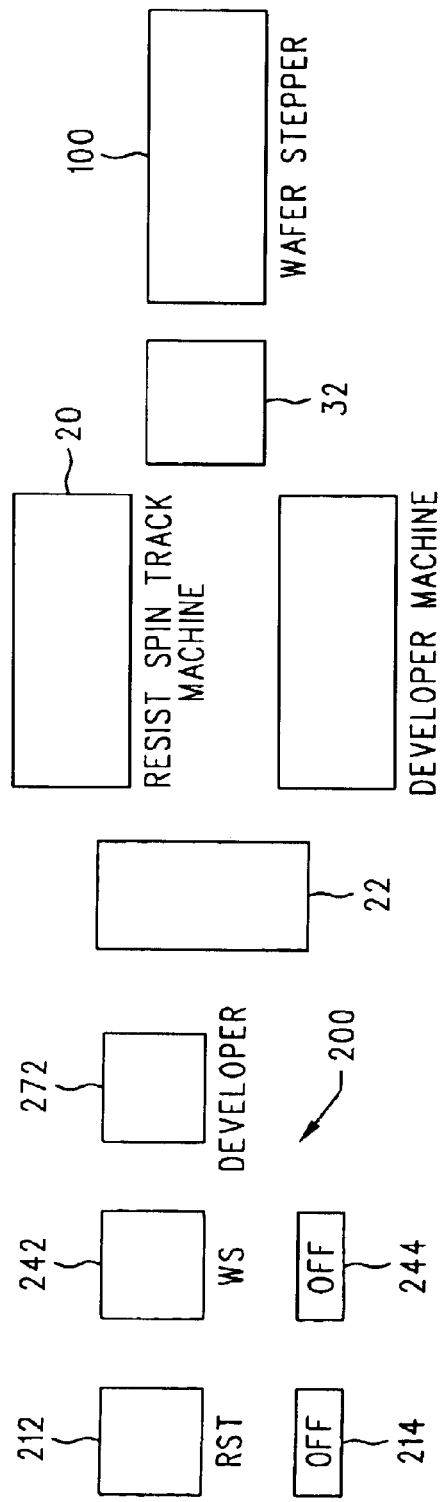

For illustration purposes, the operating sequence will be described as beginning with no lot boxes located on the WIP table 200 and no wafers being processed by the resist spin track machine 20, the wafer stepper machine 100 or the developer. This idle configuration is illustrated in FIG. 6. Referring to FIG. 6, it can be seen that both of the display devices 214, 244 are in an "off" condition. The display devices 214, 244 will display such an off condition when no lot box is located within the corresponding nest.

Figure 7:
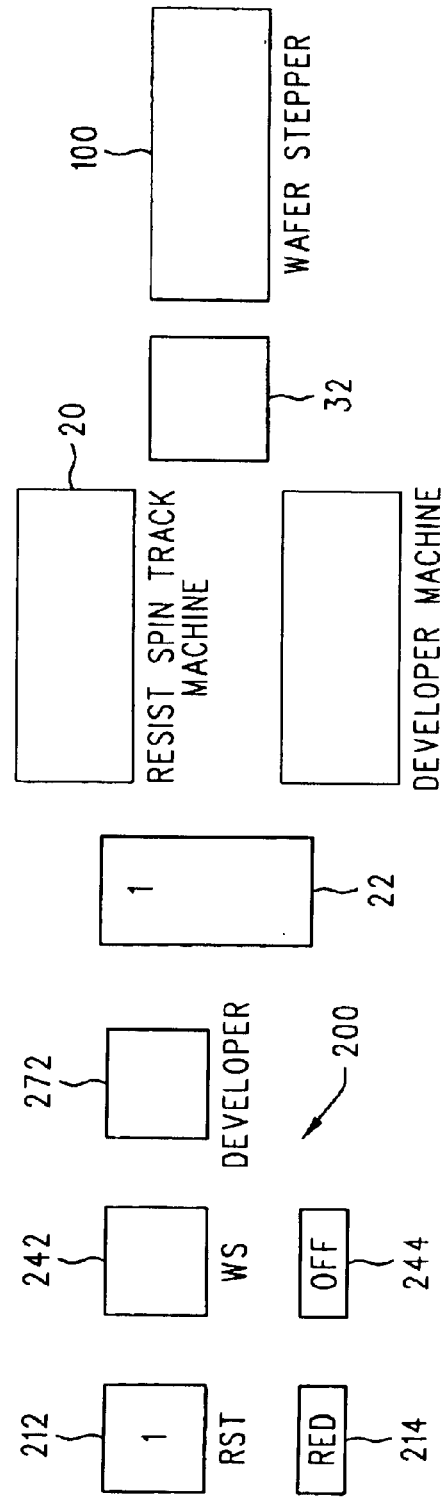

In FIG. 7, a lot box, designated "1" has been placed in the WIP table nest 212 by a human operator. Upon sensing the presence of the lot box 1, via the microswitch located beneath the nest 212, the WIP table controller 360 initiates a scan with the barcode reader 220 to determine the lot number of lot box 1. This lot number is then stored in the resist spin track area of the history file as described above. Since this lot has not previously been set up in the system, the controller 360 causes the display device 214 to turn red, as indicated. This red display indicates to the operator that the lot box 1 may not be removed from the nest 212. Upon placing lot box 1 in the nest 212, the operator will open the lot box, remove the cassette of wafers therefrom and place the cassette on one of the indexers, as indicated by the "1" in the indexers box 22 in FIG. 7. The resist spin track machine controller 370 recognizes that a cassette has been installed on one of the indexers 22. In response to this recognition, the resist spin track controller 370 queries the WIP table controller 360 via the data link 372 to determine the lot number currently stored in the resist spin track area of the history file. As can be appreciated, this lot number will be indicative of the wafer lot now in position on the indexer 22.

After acquiring the lot number for lot 1, the resist spin track controller 370 then queries the main controller 190, via the data link 192, to determine the mask level of the current lot. After determining the mask level, the resist spin track machine controller 170 queries the resist spin track database 180, via the data link 182, to determine the resist spin track recipe based upon the particular lot number and mask level corresponding to lot 1. The resist spin track machine controller 170 then uses this recipe information to set up the indexer containing the lot 1 cassette. The resist spin track machine controller 370 may then wait for a human operator to manually activate the start button on the resist spin track machine indexer. After the start button is activated, since the resist spin track machine 20 is currently idle, the indexer will cause lot 1 wafers to begin processing in the resist spin track machine.

Figure 8:
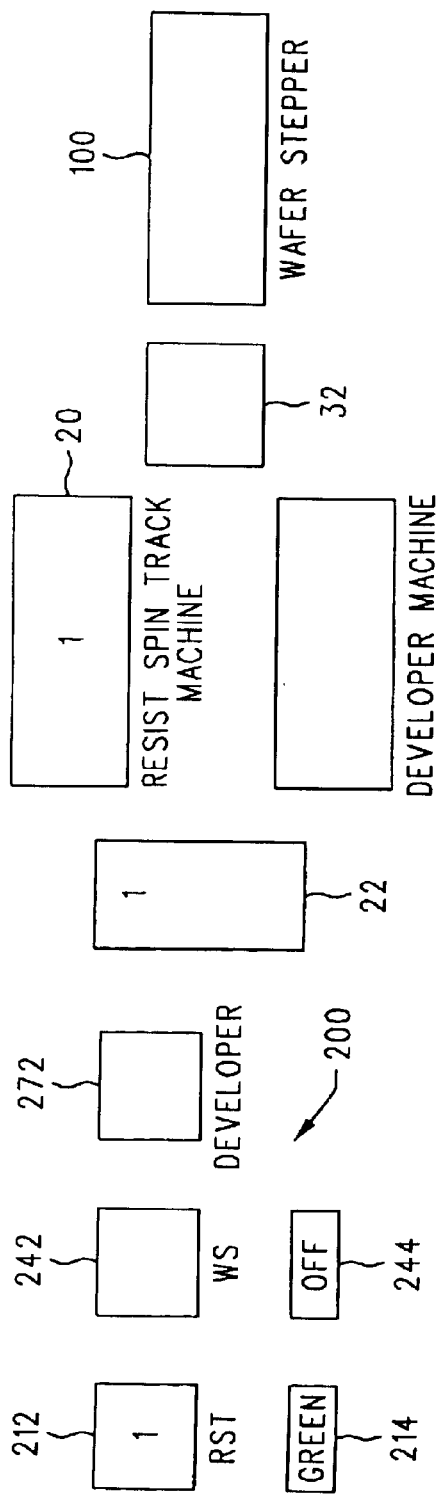

FIG. 8 illustrates the configuration immediately after the start button has been activated by a human operator. As can be seen, the first wafer from lot 1 has now begun processing in the resist spin track machine 20 as indicated in FIG. 8 by the 1 in box 20. The remaining lot 1 wafers are still on the indexer 22. Once the resist spin track machine controller 370 advises the WIP table controller 360 that the start button has been pressed, the WIP station controller 360 will cause the display device 214 to turn green, as illustrated in FIG. 8.

Figure 9:
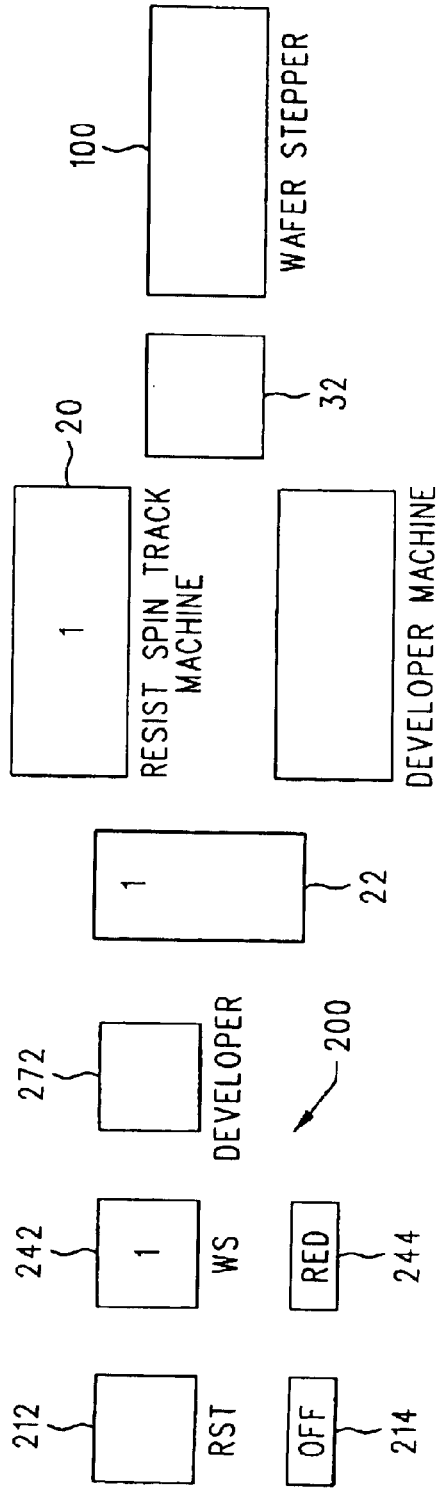

The green light on the display device 214, as illustrated in FIG. 8, indicates to a human operator that the lot box 1 may now be moved to the next position, i.e., the nest 242. FIG. 9 illustrates the condition after lot box 1 has been moved to nest 242. As can be seen, the display device 244 has now turned red, indicating that lot box 1 cannot be moved further. Display device 214 has turned off since a lot box is no longer present in nest 212.

Sensing a lot box in the nest 242, via the microswitch 266 located beneath the nest 242, WIP table controller 360 performs a scan with the barcode reader 250 to determine the lot number of box 1. This lot number is then stored in the wafer stepper area of the history file in a manner as previously described. The lot number is also immediately sent to the wafer stepper machine controller 170.

At this point, since the wafer stepper machine 100 is currently idle, the wafer stepper controller 170 accepts the new lot number from the WIP table controller 360. As can be appreciated, the lot number of the lot box in the nest 242 will be indicative of the wafer lot which will next be processed by the wafer stepper machine 100, i.e., lot 1 in the present example.

The wafer stepper machine controller 170 then queries the main controller 190, via the data link 194, to determine what mask level the current lot is on and to determine the reticle identification number. After determining the mask level and reticle identification number, the wafer stepper machine controller 170 queries the wafer stepper parameter database 186, via the data link 188, to determine other wafer stepper machine setup parameters based upon the particular lot number and mask level of the present lot. The wafer stepper machine controller 170 then uses this parameter information to set up the wafer stepper machine 100 to process the lot (lot 1 in the present example).

After the parameter lookup sequence is completed, the wafer stepper machine controller 170 will proceed to actually set up the wafer stepper machine 100 with the identified parameters. At this point, the wafer stepper machine is ready to begin processing lot 1.

One of the parameters determined during the above process is the reticle number required to process the lot. When performing the setup operation described above, the wafer stepper controller 170 will cause a scan to be performed with the barcode readers 152, 162, FIG. 2, in order to determine which library slot contains the desired reticle. Once the proper slot is located, the robotic picker within the wafer stepper machine 100 will cause the reticle in that slot to be used to process the lot, in a manner as previously described.

Figure 10:
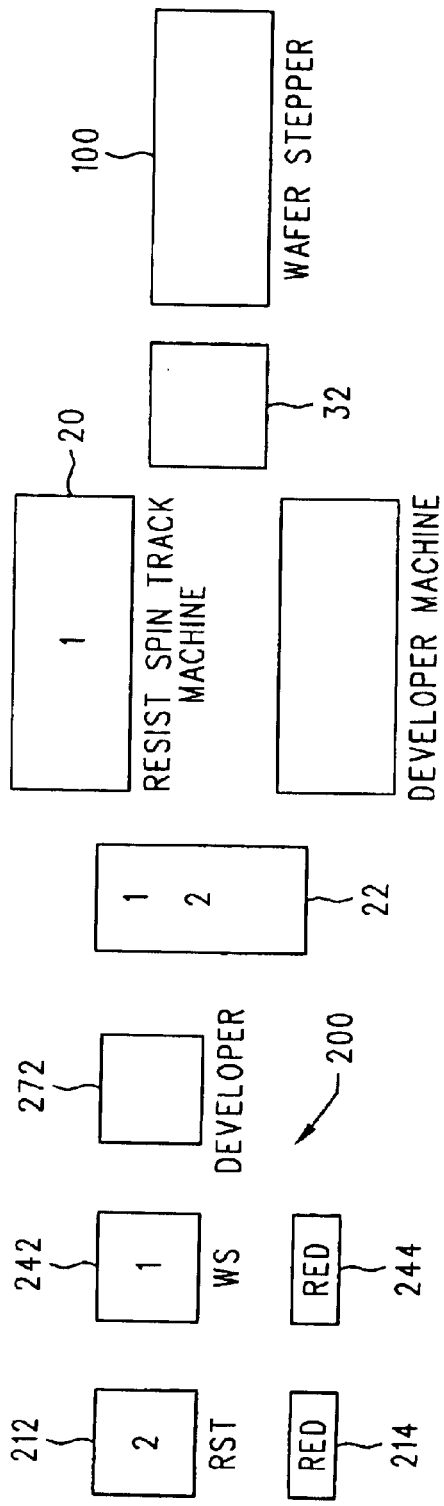

FIG. 10 illustrates the condition after a new lot, designated as lot "2", has entered the system and lot box 2 has been placed in the resist spin track nest 212. Upon sensing the presence of the lot box 2, via the microswitch located beneath the nest 212, the WIP table controller 360 initiates a scan with the barcode reader 220 to determine the lot number of lot box 2. This lot number is then stored in the resist spin track area of the history file as described above. Since this lot has not previously been set up in the system, the controller 360 causes the display device 214 to turn red, as indicated. This red display indicates to the operator that the lot box 1 may not be removed from the nest 212. Upon placing lot box 1 in the nest 212, the operator will open the lot box, remove the cassette of wafers therefrom and place the cassette on one of the indexers, as indicated by the "2" in the indexers box 22 in FIG. 10. The resist spin track machine controller 370 recognizes that a cassette has been installed on one of the indexers 22. In response to this recognition, the resist spin track controller 370 queries the WIP table controller 360 via the data link 372 to determine the lot number currently stored in the resist spin track area of the history file. As can be appreciated, this lot number will be indicative of the wafer lot now in position on the indexer 22.

After acquiring the lot number for lot 2, the resist spin track controller 370 then queries the main controller 190, via the data link 192, to determine what mask level the current lot is on. After determining the mask level, the resist spin track machine controller 170 queries the resist spin track database 180, via the data link 182, to determine the resist spin track recipe based upon the particular lot number and mask level corresponding to lot 2.

The recipe identified for lot 2 will be selected on the indexer containing the lot 2 cassette. After the lot 2 parameter identification procedure is completed, the display device 214 will remain red until the resist spin track machine start button (on the indexer containing the lot 2 cassette) is depressed by a human operator.

Figure 11:
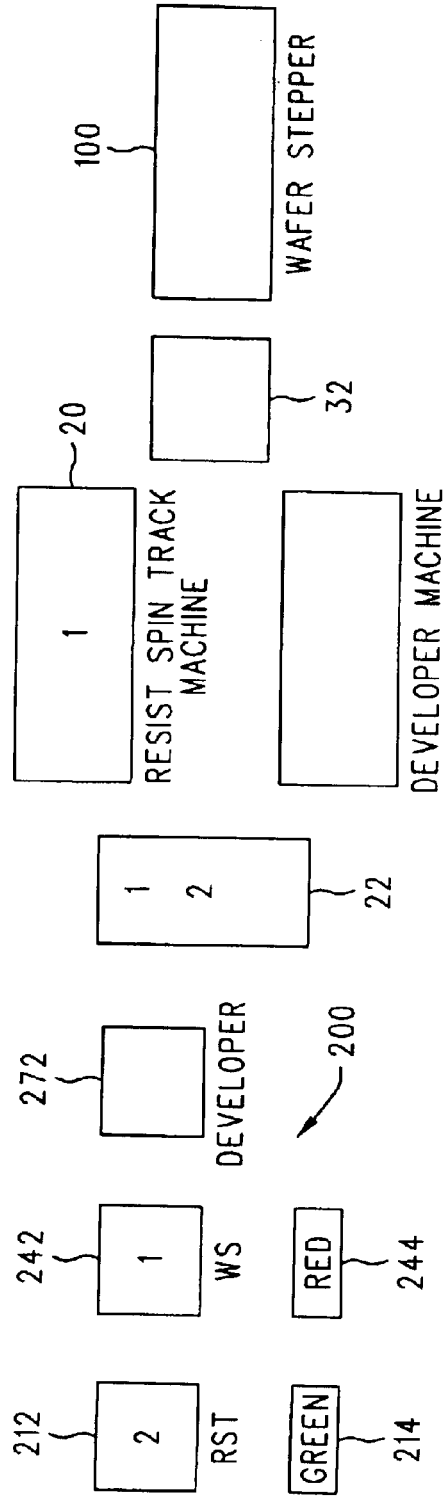

FIG. 11 illustrates the configuration immediately after the start button on the indexer containing the lot 2 cassette has been activated by a human operator. At this point, the display device 214 turns green, as illustrated in FIG. 11. Although the display device 214 is green, lot box 2 cannot be moved from the nest 212 because the next position, i.e., nest 242, is still occupied by the lot 1 box.

In FIG. 12, wafers from lot 1 have now entered the buffer 32 (as indicated by the 1 in the box 32 in FIG. 12) and the first lot 1 wafer has just completed processing in the wafer stepper machine 100 (as indicated by the 1 in the box 100 in FIG. 12. In response to the first wafer from lot 1 being processed in the wafer stepper, as illustrated in FIG. 12, the wafer stepper controller 170 has sent a signal to the WIP table controller 360, via the data link 176, indicating that the first wafer from lot 1 has been successfully processed. In response to this signal, the WIP table controller 360 causes the display device 244 to turn green, as indicated in FIG. 12. This green display, in turn, indicates to a human operator that lot box 1 may be removed from the nest 242 and advanced to the next nest, i.e., the nest 272.

FIG. 13 illustrates the situation after a human operator has moved lot box 1 from the nest 242 to the nest 272. The display device 244 has now turned to the off condition since no lot box is present in the nest 242. Since no setup is required for the developer, however, no action is taken by the WIP table controller 360 in response to this movement. Wafers from lot 1 may now have entered the developer, as indicated by the 1 in the developer box in FIG. 13.

In FIG. 14, a human operator has moved lot box 2 from the nest 212 to the nest 242. As illustrated, the display device 244 has turned red, indicating that the lot box 2 cannot be moved further and the display device 214 has turned off since no lot box is within the nest 212. Recognizing that a new lot box has been placed in the stepper nest 242, the WIP table controller 360 scans the lot 2 number and stores it in the resist spin track area of the history file in a manner as described previously with respect to lot 1. The controller 360 also immediately sends the lot 2 lot number to the wafer stepper controller 170. Since, however, the wafer stepper machine is currently still processing wafers from lot 1, the controller will not accept the new lot number.

In FIG. 15, a human operator has placed a new lot box in the resist spin track nest 212, as indicated by the "3" in the box 212 in FIG. 15. The WIP table controller 360 has caused the display device 214 to turn red, indicating that the lot box 3 cannot be moved further. The human operator has also placed the cassette of wafers from lot box 3 onto the resist spin track indexer 22 as indicated by the 3 in the box 22 in FIG. 15.

It is noted that, in FIG. 15, the wafers from lot 1 have completed processing in the resist spin track machine 20. Upon completion of the lot 1 wafers, the indexer containing the lot 2 cassette will automatically set up the resist spin track machine using the lot 2 setup recipe previously obtained and will thereafter automatically cause the resist spin track machine to begin processing lot 2 wafers. FIG. 15 illustrates the situation in which the first wafer from lot 2 has begun processing within the resist spin track machine 20.

Meanwhile, the resist spin track machine controller 370 recognizes that a new cassette (i.e. the lot 3 cassette) has been installed on one of the indexers 22. In response to this recognition, the resist spin track machine controller queries the WIP table controller 360, via the data link 372, to find out what lot number is in the nest 212 and obtains the resist spin track recipe for lot 3 in a manner as previously described with respect to lots 1 and 2. As in previous examples, after the lot 3 recipe identification procedure is completed, the display device 214 will remain red until the resist spin track machine indexer start button is depressed by a human operator.

FIG. 16 illustrates the configuration immediately after the start button has been activated by a human operator. At this point, the display device 214 turns green, as illustrated in FIG. 16. Although the display device 214 is green, lot box 3 cannot be moved from the nest 212 because the next position, i.e., nest 242, is still occupied by the lot 2 box.

FIG. 16 also illustrates the configuration immediately after lot 1 has completed processing within the wafer stepper machine 100. As can be seen from FIG. 16, although lot 1 wafers are still within the developer, there are no wafers within the wafer stepper machine 100. At this point, since the last lot 1 wafer has been processed, and end of lot signal is sent to the WIP table controller 360, in a manner as previously described. In response to this end of lot signal, WIP table controller sends the new lot number (i.e., for lot 2, in this example) from the wafer stepper area of the history file to the wafer stepper controller 170. The wafer stepper controller 170 may then begin setting up the wafer stepper machine 100 for the next lot (i.e., lot 2) in a manner as previously described with respect to lot 1. Once the wafer stepper machine setup is complete, the wafer stepper controller 170 will instruct the wafer stepper machine 100 to begin processing lot 2 wafers.

In FIG. 17, the first lot 2 wafer has just completed processing in the wafer stepper 100 (as indicated by the 2 in the box 100 in FIG. 12). Accordingly, in FIG. 17, the wafer stepper controller 170 has sent a signal to the WIP table controller 360, via the data link 176, indicating that the first wafer from lot 2 has been successfully processed. In response to this signal, the WIP table controller 360 causes the display device 244 to turn green, as indicated in FIG. 17. This green display, in turn, indicates to a human operator that lot box 2 may be removed from the nest 242 and advanced to the next nest, i.e., the nest 272.

FIG. 17 also illustrates the condition in which wafer lot 1 has completely exited the system. Specifically, all of the wafers from lot 1 have exited the developer and have been returned to the lot 1 cassette by the indexer 22. A human operator has removed the lot 1 cassette from the indexer and returned the cassette to its lot box, still residing in the nest 272. Subsequently, a human operator removed the lot 1 box from the nest 272 and forwarded it to other processing areas, thus resulting in the configuration depicted in FIG. 17.

The lot boxes 2 and 3 may be now advanced to the next nest positions, i.e., the nest positions 272, 242, respectively, and a new lot introduced in the nest 212. Thereafter, the process described above may be repeated for subsequent wafer lots. As can be appreciated, the process described above, in conjunction with the WIP table 200 and the control system 350, allows setup parameters for new wafer lots to automatically be obtained without the need for realtime intervention by a human operator. In previous arrangements, for example, realtime attention was required by a human operator each time that a lot completed processing in the wafer stepper machine 100. Specifically, a human operator was required to look up and enter wafer stepper setup parameter data before a new wafer lot could begin processing within the wafer stepper machine. If an operator was not available when a lot completed processing in the wafer stepper machine, the system would sit idle, waiting for a human operator to become available, thus resulting in machine downtime.

Under the present system, however, a human operator can, for example, move a new lot box into position on the WIP table wafer stepper nest 242 at any time after the first wafer of the previous lot has completed processing in the wafer stepper machine. Once the new lot box is in position within the nest 242, the system will automatically obtain the wafer stepper setup parameters for the new lot. Under the present system, a human operator may, for example, have about thirty minutes (assuming a 24 wafer lot) in which to move a new lot box into the nest 242 (from the time the display device 244 turns green until the time that the new setup parameters are required in the wafer stepper machine). Accordingly, the present method and apparatus avoid the problems associated with realtime operator intervention, as previously described.

It is noted that, although the apparatus and method set forth above have been described with respect to an integrated circuit photolithographic process, this apparatus and method could readily be used in any other type of manufacturing process in order to enhance reliability and efficiency.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. A manufacturing system for manufacturing integrated circuit devices comprising:

at least a first manufacturing machine;

a human interface device including:

at least a first station associated therewith;

at least a first display device located adjacent said first station; and at least a first scanning device located adjacent said first station;

a first controller operatively connected to both said first display device and said first scanning device;

a second controller operatively connected to said at least a first manufacturing machine;

a data link connecting said first controller and said second controller;

at least a second station associated with said human interface device;

at least a second display device located adjacent said at least a second station;

at least a second scanning device located adjacent said second station;

wherein said first controller is operatively attached to both said second display device and said second scanning device; and wherein said first display device indicates to a human user when to move an object from said first station to said second station.

2. The manufacturing system of claim 1 wherein said system comprises a photolithographic integrated circuit manufacturing system.

3. The manufacturing system of claim 1 wherein said at least a first manufacturing machine comprises a wafer stepper machine.

4. The manufacturing system of claim 1 and further comprising:

at least a second manufacturing machine;

a third controller operatively connected to said at least a second manufacturing machine; and a data link connecting said first controller and said third controller.

5. The manufacturing system of claim 4 wherein said second manufacturing machine is a resist spin track machine.

* * * * *